(12) United States Patent
Kreupl et al.

(10) Patent No.: US 8,471,360 B2
(45) Date of Patent: Jun. 25, 2013

(54) MEMORY CELL WITH CARBON SWITCHING MATERIAL HAVING A REDUCED CROSS-SECTIONAL AREA AND METHODS FOR FORMING THE SAME

(75) Inventors: Franz Kreupl, Mountain View, CA (US); Er-Xuan Ping, Fremont, CA (US); Jingyan Zhang, Santa Clara, CA (US); Huiwen Xu, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 430 days.

(21) Appl. No.: 12/760,156

(22) Filed: Apr. 14, 2010

(65) Prior Publication Data

US 2011/0254126 A1    Oct. 20, 2011

(51) Int. Cl.
*H01L 29/92* (2006.01)
(52) U.S. Cl.
USPC .............. 257/532; 257/5; 257/480; 257/537; 257/E21.008; 257/E29.343
(58) Field of Classification Search
USPC ....... 257/5, 532, 537, 480, E29.343, E21.008
See application file for complete search history.

(56) References Cited

U.S. PATENT DOCUMENTS

| | | |
|---|---|---|
| 4,599,705 A | 7/1986 | Holmberg et al. |
| 5,406,509 A | 4/1995 | Ovshinsky et al. |
| 5,687,112 A | 11/1997 | Ovshinsky |
| 5,751,012 A | 5/1998 | Wolstenholme et al. |
| 5,825,046 A | 10/1998 | Czubatyj et al. |
| 5,831,276 A | 11/1998 | Gonzalez et al. |
| 5,915,167 A | 6/1999 | Leedy |
| 5,952,671 A | 9/1999 | Reinberg et al. |
| 6,071,597 A | 6/2000 | Yang et al. |
| 6,100,193 A | 8/2000 | Suehiro et al. |
| 6,114,713 A | 9/2000 | Zahorik |
| 6,214,107 B1 | 4/2001 | Kitabatake |
| 6,369,431 B1 | 4/2002 | Gonzalez et al. |
| 6,388,933 B2 | 5/2002 | Marr |
| 6,563,220 B2 | 5/2003 | Gonzalez et al. |
| 6,643,159 B2 | 11/2003 | Fricke et al. |

(Continued)

FOREIGN PATENT DOCUMENTS

| | | |
|---|---|---|
| EP | 0 028 707 | 5/1981 |
| EP | 1 892 722 | 2/2008 |

(Continued)

OTHER PUBLICATIONS

Sin, C-Y et al., "Resist trimming in high-density CF4/02 Plasmas for sub-0.1 [mu]m device fabrication", Jour. Vacuum Sci. & Techno. B (Microelectronics and Nanometer Structures) AIP for American Vacuum Soc. USA, vol. 20, No. 5, pp. 1974-1981, 2002.

(Continued)

*Primary Examiner* — Minchul Yang
(74) *Attorney, Agent, or Firm* — Dugan & Dugan, PC

(57) ABSTRACT

In a first aspect, a method of forming a metal-insulator-metal ("MIM") stack is provided, the method including: (1) forming a dielectric material having an opening and a first conductive carbon layer within the opening; (2) forming a spacer in the opening; (3) forming a carbon-based switching material on a sidewall of the spacer; and (4) forming a second conductive carbon layer above the carbon-based switching material. A ratio of a cross sectional area of the opening in the dielectric material to a cross sectional area of the carbon-based switching material on the sidewall of the spacer is at least 5. Numerous other aspects are provided.

18 Claims, 18 Drawing Sheets

U.S. PATENT DOCUMENTS

| | | |
|---|---|---|
| 6,670,713 B2 | 12/2003 | Gonzalez et al. |
| 6,744,088 B1 | 6/2004 | Dennison |
| 6,841,846 B1 | 1/2005 | Chen et al. |
| 6,885,021 B2 | 4/2005 | Apodaca et al. |
| 6,937,507 B2 | 8/2005 | Chen |
| 6,952,030 B2 | 10/2005 | Herner et al. |
| 6,960,495 B2 | 11/2005 | Vyvoda et al. |
| 6,984,561 B2 | 1/2006 | Herner et al. |
| 6,995,422 B2 | 2/2006 | Herner et al. |
| 7,009,275 B2 | 3/2006 | Herner et al. |
| 7,026,212 B2 | 4/2006 | Herner et al. |
| 7,084,062 B1 | 8/2006 | Avanzino et al. |
| 7,176,064 B2 | 2/2007 | Herner |
| 7,205,562 B2 | 4/2007 | Wicker |
| 7,238,607 B2 | 7/2007 | Dunton et al. |
| 7,259,038 B2 | 8/2007 | Scheuerlein et al. |
| 7,265,049 B2 | 9/2007 | Herner et al. |
| 7,271,440 B2 | 9/2007 | Harshfield |
| 7,285,464 B2 | 10/2007 | Herner et al. |
| 7,301,191 B1 | 11/2007 | Tombler et al. |
| 7,345,296 B2 | 3/2008 | Tombler, Jr. et al. |
| 7,361,586 B2 | 4/2008 | Adem et al. |
| 7,405,465 B2 | 7/2008 | Herner |
| 7,417,245 B2 | 8/2008 | Happ et al. |
| 7,426,128 B2 | 9/2008 | Scheuerlein |
| 7,483,285 B2 | 1/2009 | Furukawa et al. |
| 7,575,984 B2 | 8/2009 | Radigan |
| 7,602,042 B2 | 10/2009 | Ahn et al. |
| 7,705,343 B2 | 4/2010 | Suh et al. |
| 7,728,405 B2 | 6/2010 | Kreupl |
| 7,830,698 B2 | 11/2010 | Chen et al. |
| 7,955,981 B2 | 6/2011 | Chen et al. |
| 8,023,310 B2 | 9/2011 | Fu et al. |
| 8,039,919 B2 | 10/2011 | Moon et al. |
| 8,093,123 B2 | 1/2012 | Xu et al. |
| 8,114,765 B2 | 2/2012 | Xu et al. |
| 2003/0073295 A1 | 4/2003 | Xu |
| 2004/0159835 A1 | 8/2004 | Krieger et al. |
| 2004/0251551 A1 | 12/2004 | Hideki |
| 2005/0052915 A1 | 3/2005 | Herner et al. |
| 2005/0158950 A1 | 7/2005 | Scheuerlein et al. |
| 2005/0226067 A1 | 10/2005 | Herner et al. |
| 2006/0046407 A1 | 3/2006 | Juengling |
| 2006/0097342 A1 | 5/2006 | Parkinson |
| 2006/0118782 A1 | 6/2006 | Zettl et al. |
| 2006/0175596 A1 | 8/2006 | Happ et al. |
| 2006/0250836 A1 | 11/2006 | Herner |
| 2006/0258109 A1 | 11/2006 | Juengling |
| 2006/0273298 A1 | 12/2006 | Petti |
| 2007/0034936 A1 | 2/2007 | Van Schaijk et al. |
| 2007/0123053 A1 | 5/2007 | Kim et al. |
| 2007/0190722 A1 | 8/2007 | Herner |
| 2008/0017894 A1 | 1/2008 | Happ et al. |
| 2008/0070162 A1 | 3/2008 | Ufert |
| 2008/0116441 A1 | 5/2008 | Raghuram |
| 2008/0173858 A1 | 7/2008 | An et al. |
| 2008/0217732 A1 | 9/2008 | Kreupl |
| 2008/0232160 A1 | 9/2008 | Gopalakrishnan |
| 2009/0108368 A1 | 4/2009 | Kanegae et al. |
| 2009/0168491 A1 | 7/2009 | Schricker |
| 2009/0201715 A1 | 8/2009 | Kreupl |
| 2009/0257265 A1 | 10/2009 | Chen et al. |
| 2009/0257270 A1 | 10/2009 | Schricker |
| 2009/0262572 A1 | 10/2009 | Krusin-Elbaum |
| 2009/0294832 A1 | 12/2009 | Kakoschke et al. |
| 2010/0006811 A1 | 1/2010 | Xu |
| 2010/0006812 A1 | 1/2010 | Xu |
| 2010/0012914 A1 | 1/2010 | Xu et al. |
| 2010/0032638 A1 | 2/2010 | Xu |
| 2010/0032639 A1 | 2/2010 | Xu |
| 2010/0032640 A1 | 2/2010 | Xu |
| 2010/0032643 A1 | 2/2010 | Xu |
| 2010/0038620 A1 | 2/2010 | Xu et al. |
| 2010/0038623 A1 | 2/2010 | Xu et al. |
| 2010/0081268 A1 | 4/2010 | Schricker et al. |
| 2010/0108976 A1 | 5/2010 | Jayasekara et al. |
| 2010/0108982 A1 | 5/2010 | Ping et al. |
| 2010/0155687 A1* | 6/2010 | Reyes et al. ........................ 257/4 |
| 2010/0163824 A1 | 7/2010 | Xu et al. |
| 2010/0176366 A1 | 7/2010 | Fu et al. |
| 2010/0193916 A1 | 8/2010 | Xu et al. |
| 2010/0291747 A1 | 11/2010 | Lung et al. |
| 2010/0327254 A1 | 12/2010 | Chen et al. |
| 2011/0037045 A1 | 2/2011 | Fukumizu et al. |
| 2011/0117679 A1 | 5/2011 | Lee et al. |
| 2011/0204313 A1 | 8/2011 | Chen et al. |
| 2011/0278529 A1 | 11/2011 | Xu |
| 2012/0135603 A1 | 5/2012 | Xu et al. |

FOREIGN PATENT DOCUMENTS

| | | |
|---|---|---|
| EP | 1 916 722 | 4/2008 |
| JP | 2009 218259 | 9/2009 |
| WO | WO 2004/070735 | 8/2004 |
| WO | WO 2006/078505 A2 | 7/2006 |
| WO | WO 2008/078197 | 7/2008 |
| WO | WO 2009/043023 A2 | 4/2009 |
| WO | WO 2009/088889 | 7/2009 |
| WO | WO 2009/110120 | 9/2009 |
| WO | WO 2009/126846 | 10/2009 |
| WO | WO 2009/126891 | 10/2009 |
| WO | WO 2010/017428 | 2/2010 |

OTHER PUBLICATIONS

Eyoum, M-A et al., "Ashing Technique for Nano-Gap Fabrication of Electrostatic Transducers", Materials Research Society Symposium Proceedings; [Materials Research Society Symposium Proceedings], Materials Research Society, USA, vol. EXS-02, pp. 145-147, 2003.

Li et al., "Electronic Two-Terminal Bistable Graphitic Memories", Nature Materials, vol. 7, 2008, pp. 966-971.

Maxwell, U.S. Appl. No. 12/703,907, filed Feb. 11, 2010.

Li et al., U.S. Appl. No. 12/631,913, filed Dec. 7, 2009.

Franz Kreupl et al., U.S. Appl. No. 12/711,810, filed Feb. 24, 2010.

Xu, U.S. Appl. No. 12/604,178, filed Oct. 22, 2009.

Li et al., U.S. Appl. No. 12/714,359, filed Feb. 26, 2010.

Kreupl et al., "Carbon-Based Resistive Memory", Jun. 26, 2008, IEDM 2008, pp. 1-4.

Gateru et al., "Memory Switching in Ion Bombarded Amorphous Silicon Carbide Thin Film Devices", 2003, Materials Research Society, Mat. Res. Soc. Symp. Proc., vol. 742, pp. 79-83.

Shannon et al., "Memory Switching in Amorphous Silicon-Rich Silicon Carbide", Oct. 28, 1999, Electronics Letters, vol. 35, No. 22, pp. 1976-1978.

Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.

Takai et al.,"Structure and Electronic Properties of a Nongraphitic Disordered Carbon System and its Heat-Treatment Effects", Physical Review B 67, 214202, pp. 214202-1-214202-11, published Jun. 19, 2003.

Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.

Dittmer et al., "Low ambient temperature CVD growth of carbon nanotubes," Appl. Phys. A 84,243-246 (2006), p. 1, published online May 17, 2006.

Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678, Received Jun. 14, 2006.

Kong et al., "Integration of a gate electrode into carbon nanotube devices for scanning tunneling microscopy," Appl. Phys. Lett. 86, 2005, pp. 112106-1-112106-3, published online Mar. 8, 2005.

Bhattacharyya, et al., "Switching behaviour and high frequency response of amorphous carbon double-barrier structures", Aug. 2007, Materials Science and Engineering C, Elsevier Science S.A, CH, vol. 27 No. 5-8, pp. 957-960, available online Nov. 13, 2006.

Xu et al., U.S. Appl. No. 12/834,942, filed Jul. 13, 2010.

Xu et al., U.S. Appl. No. 112/835,236, filed Jul. 13, 2010.

International Search Report and Written Opinion of International Application No. PCT/US2011/032039 mailed Aug. 3, 2011.

Communication pursuant to Rules 161(1) and 162(EPC) in counterpart European Application No. 11717383.1 dated Nov. 21, 2012.

* cited by examiner

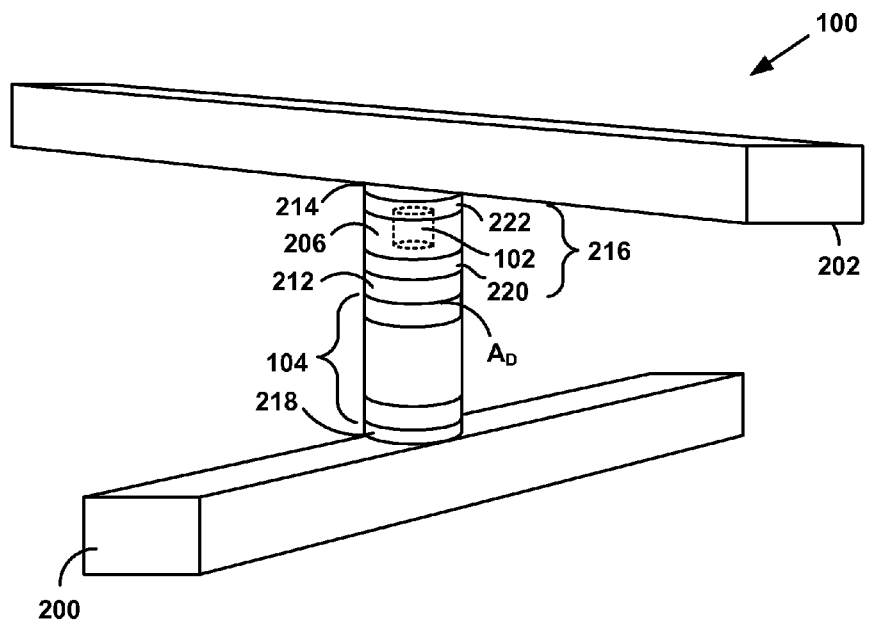
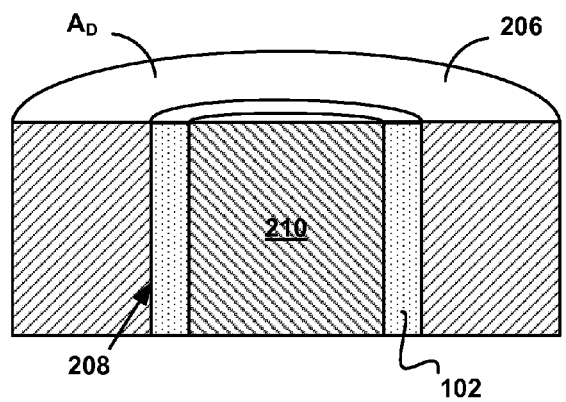
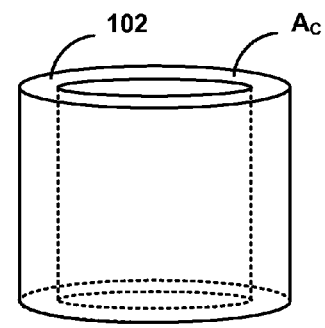
FIG. 2A
FIG. 2B          FIG. 2C

US 8,471,360 B2

MEMORY CELL WITH CARBON SWITCHING MATERIAL HAVING A REDUCED CROSS-SECTIONAL AREA AND METHODS FOR FORMING THE SAME

CROSS REFERENCE TO RELATED APPLICATION

This application is related to U.S. patent application Ser. No. 12/711,810, filed Feb. 24, 2010, and titled "Memory Cell With Silicon-Containing Carbon Switching Layer And Methods For Forming The Same" (Docket No. MXA-385), which is hereby incorporated by reference herein in its entirety for all purposes.

TECHNICAL FIELD

This invention relates to non-volatile memories, and more particularly to a memory cell with a carbon switching material having a reduced cross-sectional area and methods for forming the same.

BACKGROUND

Non-volatile memories formed from carbon-based reversible resistance-switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 Application"), which is hereby incorporated by reference herein in its entirety for all purposes, describes a rewriteable non-volatile memory cell that includes a diode coupled in series with a carbon-based reversible resistivity-switching material.

However, fabricating memory devices from carbon-based switching materials is technically challenging, and improved methods of forming memory devices that employ carbon-based switching materials are desirable.

SUMMARY

In a first aspect of the invention, a method of forming a metal-insulator-metal ("MIM") stack is provided, the method including: (1) forming a dielectric material having an opening and a first conductive carbon layer within the opening; (2) forming a spacer in the opening; (3) forming a carbon-based switching material on a sidewall of the spacer; and (4) forming a second conductive carbon layer above the carbon-based switching material. A ratio of a cross sectional area of the opening in the dielectric material to a cross sectional area of the carbon-based switching material on the sidewall of the spacer is at least 5.

In a second aspect of the invention, a method of forming a MIM stack is provided, the method including: (1) forming a first conductive carbon layer; (2) etching the first conductive carbon layer into a plurality of pillars; (3) isolating the plurality of pillars from one another with dielectric fill material; (4) planarizing the dielectric fill material to expose the plurality of pillars; (5) removing a portion of each pillar to form a plurality of first openings of a first diameter; (6) forming a spacer in each first opening to form a plurality of second openings of a second diameter that is less than the first diameter; (7) forming a carbon-based switching material on sidewalls of the second openings, thereby creating third openings of a third diameter that is less than the second diameter; (8) filling the third openings with dielectric fill material; (9) exposing the carbon-based switching material; and (10) forming a second conductive carbon layer above the exposed carbon-based switching material.

In a third aspect of the invention, a method of forming a memory cell is provided, the method including: (1) forming a MIM stack by (a) forming a dielectric material above a substrate, the dielectric material having an opening and a first conductive carbon layer within the opening; (b) forming a spacer in the opening; (c) forming a carbon-based switching material on a sidewall of the spacer; and (d) forming a second conductive carbon layer above the carbon-based switching material, wherein a ratio of a cross sectional area of the opening in the dielectric material to a cross sectional area of the carbon-based switching material on the sidewall of the spacer is at least 5; and (2) forming a steering element coupled to the MIM stack.

In a fourth aspect of the invention, a method of forming a memory cell is provided, the method including: (1) forming a MIM stack by (a) forming a first conductive carbon layer above a substrate; (b) etching the first conductive carbon layer into a plurality of pillars; (c) isolating the plurality of pillars from one another with dielectric fill material; (d) planarizing the dielectric fill material to expose the plurality of pillars; (e) removing a portion of each pillar to form a plurality of first openings of a first diameter; (f) forming a spacer in each first opening to form a plurality of second openings of a second diameter that is less than the first diameter; (g) forming a carbon-based switching material on sidewalls of the second openings, thereby creating third openings of a third diameter that is less than the second diameter; (h) filling the third openings with dielectric fill material; (i) exposing the carbon-based switching material; and (j) forming a second conductive carbon layer above the exposed carbon-based switching material; and (2) forming a steering element coupled to the MIM stack.

In a fifth aspect of the invention, a MIM stack is provided that includes: (1) a dielectric material having an opening; (2) a first conductive carbon layer within the opening; (3) a spacer above the first conductive carbon layer and in the opening; (4) a carbon-based switching material on a sidewall of the spacer; and (5) a second conductive carbon layer above the carbon-based switching material. A ratio of a cross sectional area of the opening in the dielectric material to a cross sectional area of the carbon-based switching material on the sidewall of the spacer is at least 5.

In a sixth aspect of the invention, a memory cell is provided that includes: (1) a MIM stack formed above a substrate, the MIM stack having (a) a dielectric material having an opening; (b) a first conductive carbon layer within the opening; (c) a spacer above the first conductive carbon layer and in the opening; (d) a carbon-based switching material on a sidewall of the spacer; and (e) a second conductive carbon layer above the carbon-based switching material, wherein a ratio of a cross sectional area of the opening in the dielectric material to a cross sectional area of the carbon-based switching material on the sidewall of the spacer is at least 5; and (2) a steering element coupled to the MIM stack. Numerous other aspects are provided.

Other features and aspects of this invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIG. 2A is a simplified perspective view of an exemplary memory cell in accordance with this invention;

FIG. 2B is a cross sectional, perspective view of a portion of the memory cell of FIG. 2A;

FIG. 2C is a perspective view of the carbon-based switching material of FIG. 2A;

DETAILED DESCRIPTION

Figure 1:
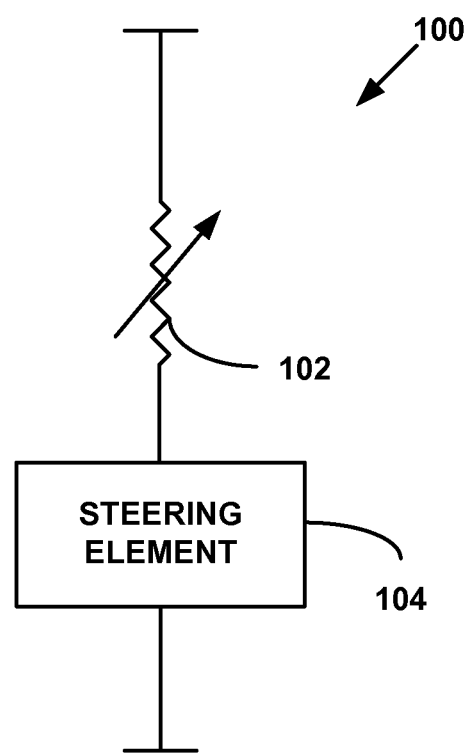
FIG. 1 is a diagram of an exemplary memory cell in accordance with this invention.

Some carbon-based materials have been shown to exhibit reversible resistivity-switching properties that may be suitable for use in non-volatile memories. As used herein, carbon-based read-writeable or "switching" materials generally may include one or more of amorphous carbon containing nanocrystalline graphene (referred to herein as "graphitic carbon"), graphene, graphite, carbon nano-tubes, amorphous diamond-like carbon ("DLC"), silicon carbide, boron carbide and other crystalline forms of carbon, and may also include secondary materials.

Carbon-based switching materials have demonstrated memory switching properties on lab-scale devices with a 100× separation between ON and OFF states and mid-to-high range resistance changes. Such a separation between ON and OFF states renders carbon-based switching materials viable candidates for memory cells in which the carbon-based switching material is coupled in series with vertical diodes, thin film transistors or other steering elements. For example, a MIM stack formed from a carbon-based switching material sandwiched between two metal or otherwise conducting layers may serve as a resistance-switching element for a memory cell. For example, a CNT MIM stack may be integrated in series with a diode or transistor to create a read-writable memory device as described, for example, in the '154 Application.

Attempts to implement carbon-based switching materials in memory devices have proven technically challenging. For instance, carbon-based switching material may be hard to switch and may require current densities that exceed the capabilities of the electrodes and/or steering element used with the switching material.

In exemplary embodiments of this invention, MIM stacks and/or memory cells and arrays are formed with carbon-based switching materials having reduced cross-sectional areas (e.g., relative to the electrodes and/or steering elements coupled to the carbon-based switching materials). The reduced cross-sectional area increases the effective resistance of the carbon-based switching material and reduces the overall current requirements, making the carbon-based switching material more compatible with the selection (steering) device used during switching of the carbon-based material.

In some embodiments, an integration friendly, damascene process may be employed to achieve the reduced cross-sectional area for the switching material. Such a damascene approach tolerates a large overlay mismatch, and may provide a current compression factor of 5 or more, and in some embodiments 15 or more.

In one or more embodiments, the carbon-based switching material may include low-hydrogen carbon, such as low-hydrogen, silicon-containing carbon. The introduction of silicon into a carbon layer increases the resistivity of the carbon layer. High current density sustaining electrodes also may be used.

As used herein, "a low-hydrogen carbon layer" or "a low-hydrogen, silicon-containing carbon layer" refers to a carbon layer having a hydrogen content of less than about 10%, in some embodiments less than about 5% and in some embodiments between about 1-5%. Exemplary low-hydrogen, silicon-containing carbon layers may have about 30-40 atm % or more silicon. The silicon may or may not be distributed uniformly. In some embodiments, only about 1-5 nanometers of the carbon layer may include 30-40 atm % or more of silicon, while the remainder of the layer may comprise more, less or no silicon. In other embodiments, other amounts of hydrogen or silicon may be present. Low-hydrogen, silicon-containing carbon layers may be formed by numerous methods, such as sputtering a graphite target, sputtering a silicon carbide target, implanting silicon into a low-hydrogen carbon layer, or the like.

Low-hydrogen carbon layers outgas and shrink less during device fabrication, making these films less likely to peel and more suitable for use in memory elements. Carbon and silicon form strong bonds so that silicon will not outgas as easily as other dopants upon heating. Silicon also suppresses $sp^2$ bond formation during heating that would otherwise decrease the resistivity of the resultant carbon film. The presence of silicon also reduces thermal conductivity of the carbon layer, which increases local heating to improve switching.

In exemplary embodiments of this invention, high current density sustaining electrodes may be employed which withstand the high current densities in carbon layer filaments during switching. This allows high current densities to be distributed safely to other metallization layers used in a memory cell. Exemplary high current density sustaining electrodes include carbon layers having primarily $sp^2$ carbon bonds (e.g., at least 50% of the carbon is $sp^2$ bonded carbon), metal carbide layers or the like. In some embodiments, such high current density sustaining electrodes may be used as part of a Schottky diode steering element for a memory cell.

These and other embodiments of the invention are described below with reference to FIGS. 1-4J.

Exemplary Inventive Memory Cell

FIG. 1 is a schematic illustration of an exemplary memory cell 100 in accordance with this invention. Memory cell 100 includes a reversible resistivity-switching material 102 coupled to a steering element 104. Reversible resistivity-switching material 102 has a resistivity that may be reversibly switched between two or more states.

For example, reversible resistivity-switching material 102 may be in an initial, low-resistivity state upon fabrication. Upon application of a first voltage and/or current, the material is switchable to a high-resistivity state. Application of a second voltage and/or current may return reversible resistivity-switching material 102 to a low-resistivity state. Alternatively, reversible resistivity-switching material 102 may be in an initial, high-resistivity state upon fabrication that is reversibly switchable to a low-resistivity state upon application of the appropriate voltage(s) and/or current(s). When used in a memory cell, one resistivity state may represent a binary "0," whereas another resistivity state may represent a binary "1", although more than two data/resistivity states may be used.

Numerous reversible resistivity-switching materials and operation of memory cells employing reversible resistivity-switching materials are described, for example, in U.S. patent application Ser. No. 11/125,939, filed May 9, 2005 and titled "Rewriteable Memory Cell Comprising A Diode And A Resistance Switching Material" (the "'939 Application"), which is hereby incorporated by reference herein in its entirety for all purposes.

Steering element 104 may include a thin film transistor, a diode, a metal-insulator-metal tunneling current device, a punch-through diode, a Schottky-diode or another similar steering element that exhibits non-ohmic conduction by selectively limiting the voltage across and/or the current flow through reversible resistivity-switching material 102. In this manner, memory cell 100 may be used as part of a two or three dimensional memory array and data may be written to and/or read from memory cell 100 without affecting the state of other memory cells in the array. In some embodiments, steering element 104 may be omitted, and memory cell 100 may be used with a remotely located steering element.

Exemplary embodiments of memory cell 100, reversible resistivity-switching material 102 and steering element 104 are described below with reference to FIGS. 2A-2F.

Exemplary Embodiments of Memory Cells and Memory Arrays

FIG. 2A is a simplified perspective view of an exemplary embodiment of a memory cell 100 in accordance with this invention in which steering element 104 is a diode. Memory cell 100 includes a carbon-based reversible resistivity-switching material 102 ("C-based switching material 102") coupled in series with a diode 104 between a first conductor 200 and a second conductor 202.

In the embodiment of FIG. 2A, a dielectric spacer 206 is employed to reduce a cross-sectional area of C-based switching material 102 relative to a cross sectional area of diode 104. In particular, as used herein, the relevant cross-sectional areas of C-based switching material 102 and diode 104 are cross-sectional areas in a direction substantially perpendicular to current flow between first conductor 200 and second conductor 202 (or current flow between second conductor 202 and first conductor 200).

For example, FIG. 2B is a cross sectional view of a thin layer of C-based switching material 102 on a sidewall 208 of dielectric spacer 206. In this manner, a hollow cylinder of C-based switching material 102 (FIG. 2C) is formed, which in some embodiments is filled with a dielectric or similar fill material 210 (FIG. 2B). Other C-based switching material shapes/configurations may be used. For example, in alternative embodiments of this invention, instead of being a hollow cylinder as depicted in FIG. 2B, C-based switching material 102 may be a solid cylinder that substantially fills the inner volume defined by sidewall 208 of dielectric spacer 206.

In some embodiments, the cross sectional area $A_C$ of C-based switching material 102 may be about 5-15 times smaller than the cross sectional area $A_D$ of diode 104 or other layers of memory cell 100. For example, as shown in FIGS. 2A and 2B, diode 104 and dielectric spacer 206 have the same cross-sectional area $A_D$. As resistance is inversely proportional to cross sectional area, the resistance through C-based switching material 102 is increased by the same factor by which the cross sectional area is reduced. The increased resistance reduces current through C-based switching material 102 during switching, making C-based switching material 102 more compatible with diode 104 (or other steering element used with memory cell 100). In this manner, the reduced cross sectional area $A_C$ of C-based switching material 102 provides a current compression factor of 5 or more, and in some embodiments 15 or more.

Resistance may also be increased by increasing the height of the hollow cylinder of C-based switching material 102 and/or by using a C-based switching material with an increased resistivity (as described below). In general, resistance may be varied by adjusting cross sectional area or resistivity of C-based switching material 102, as well as by varying the height of the hollow cylinder of C-based switching material 102.

In some embodiments, a barrier layer 212 may be formed between C-based switching material 102 and diode 104, and a barrier layer 214 may be formed between C-based switching material 102 and second conductor 202 (forming an MIM stack 216 that may serve as a reversible resistance-switching element). An additional barrier layer 218 may be formed between diode 104 and first conductor 200. Barrier layers 212, 214 and 218 may include titanium, titanium nitride, tantalum, tantalum nitride, tungsten, tungsten nitride, molybdenum, or another similar barrier layer. Barrier layer 214 may be separate from or part of second conductor 202 and barrier layer 218 may be separate from or part of first conductor 200.

In accordance with one or more embodiments of this invention, C-based switching material 102 may be a low-hydrogen, silicon-containing carbon switching layer. The presence of silicon may increase the resistivity of the carbon layer to further assist C-based switching material 102 in being more compatible with the current capabilities of steering element 104. In some embodiments, the silicon content of C-based switching material 102 may be about 30-40 atm % or more, and the hydrogen content may be between about 1-5%. The silicon in C-based switching material 102 may or may not be distributed uniformly. In some embodiments, only about 1-5 nanometers of C-based switching material 102 may include 30-40 atm % or more of silicon, while the remainder of C-based switching material 102 may comprise more, less or no silicon. Other silicon and/or hydrogen levels may be present.

C-based switching material 102 is in contact with a first conductive carbon layer 220 and a second conductive carbon layer 222, which serve as high current density sustaining electrodes for MIM stack 216. As will be described further below, conductive carbon layers 220 and 222 allow high current densities produced during switching of C-based switching material 102 to be distributed safely to other metallization layers used in memory cell 100, such as barrier layers 214 and 212, as well as top conductor 202.

Diode 104 may include any suitable diode such as a vertical polycrystalline p-n or p-i-n diode, whether upward pointing with an n-region above a p-region of the diode or downward pointing with a p-region above an n-region of the diode. In some embodiments, diode 104 may be a Schottky diode. Exemplary embodiments of diode 104 are described below with reference to FIGS. 3A-3B.

First conductor 200 and/or second conductor 202 may include any suitable conductive material such as tungsten, any appropriate metal, heavily doped semiconductor material, a conductive silicide, a conductive silicide-germanide, a conductive germanide, a highly conductive carbon or the like.

In the embodiment of FIG. 2A, first and second conductors 200 and 202, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first conductor 200 and/or second conductor 202 to improve device performance and/or aid in device fabrication.

Figure 2D:
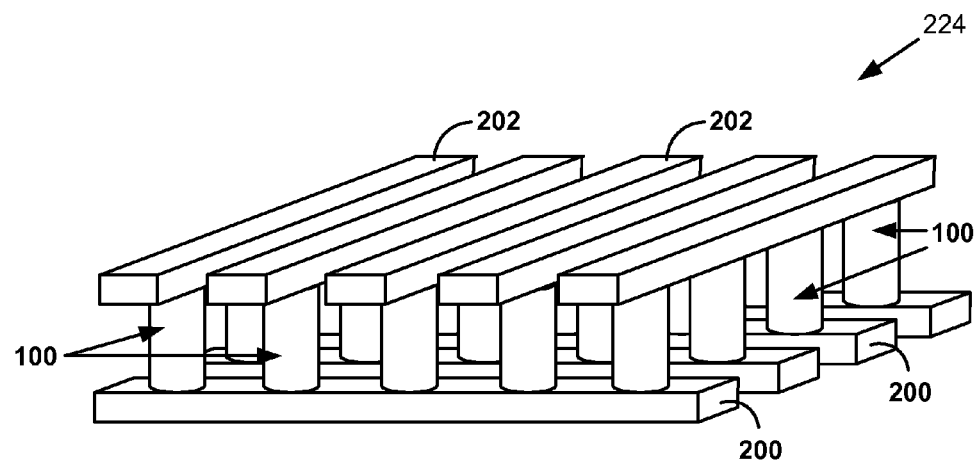
FIG. 2D is a simplified perspective view of a portion of a first exemplary memory level formed from a plurality of the memory cells of FIG. 2A.

FIG. 2D is a simplified perspective view of a portion of a first memory level 224 formed from a plurality of memory cells 100, such as memory cells 100 of FIG. 2A. For simplicity, C-based switching material 102, first and second conductive carbon layers 220 and 222, diode 104, and barrier layers 212, 214 and 218 are not separately shown. Memory array 224 is a "cross-point" array including a plurality of bit lines (second conductors 202) and word lines (first conductors 200) to which multiple memory cells are coupled (as shown). Other memory array configurations may be used, as may multiple levels of memory.

Figure 2E:
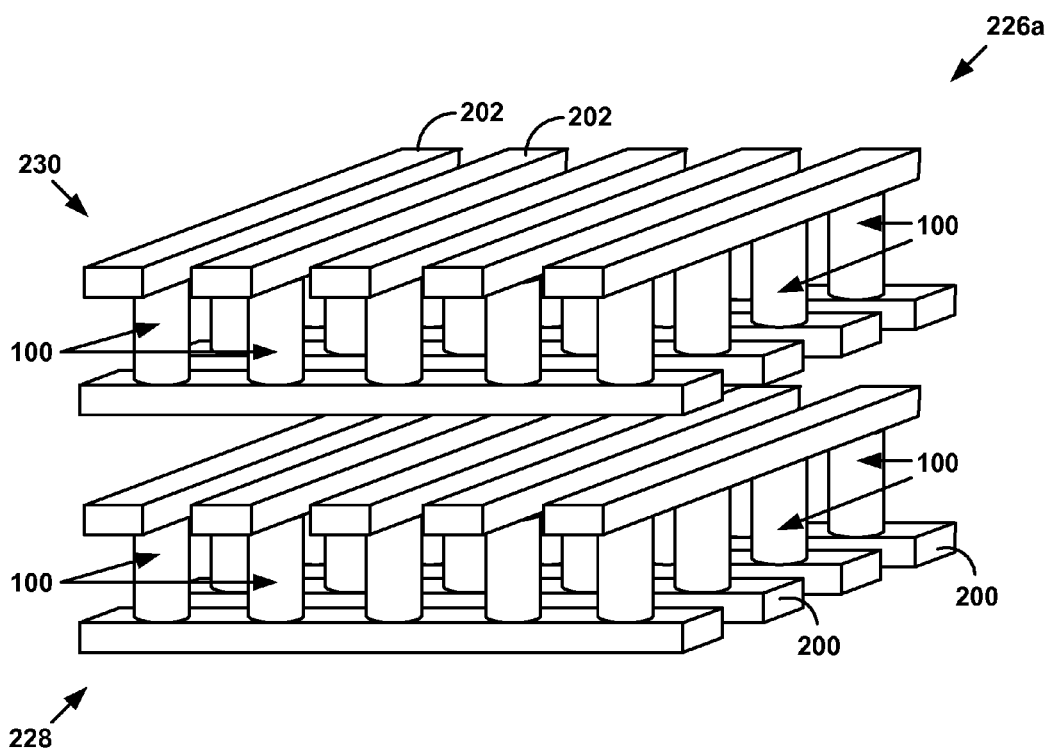
FIG. 2E is a simplified perspective view of a portion of a first exemplary three-dimensional memory array in accordance with this invention.

FIG. 2E is a simplified perspective view of a portion of a monolithic three dimensional memory array 226a that includes a first memory level 228 positioned below a second memory level 230. Memory levels 228 and 230 each include a plurality of memory cells 100 in a cross-point array. Persons of ordinary skill in the art will understand that additional layers (e.g., an interlevel dielectric) may be present between first and second memory levels 228 and 230, but are not shown in FIG. 2E for simplicity. Other memory array configurations may be used, as may additional levels of memory. In the embodiment of FIG. 2E, all diodes may "point" in the same direction, such as upward or downward depending on whether p-i-n diodes having a p-doped region on the bottom or top of the diodes are employed, simplifying diode fabrication.

Figure 2F:
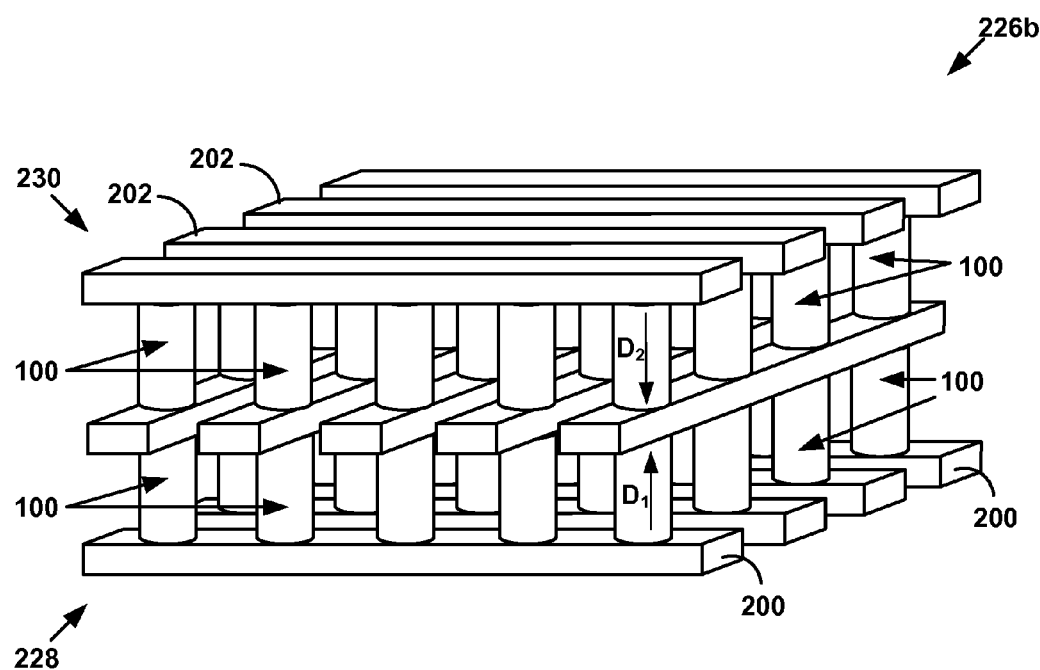
FIG. 2F is a simplified perspective view of a portion of a second exemplary three-dimensional memory array in accordance with this invention.

In some embodiments, the memory levels may be formed as described in U.S. Pat. No. 6,952,030, titled "High-Density Three-Dimensional Memory Cell," which is hereby incorporated by reference herein in its entirety for all purposes. For instance, the second conductors of a first memory level may be used as the first conductors of a second memory level that is positioned above the first memory level as shown in FIG. 2F. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes. For example, as shown in memory array 226b in FIG. 2F, the diodes of first memory level 228 may be upward pointing diodes as indicated by arrow D1 (e.g., with p regions at the bottom of the diodes), whereas the diodes of second memory level 230 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
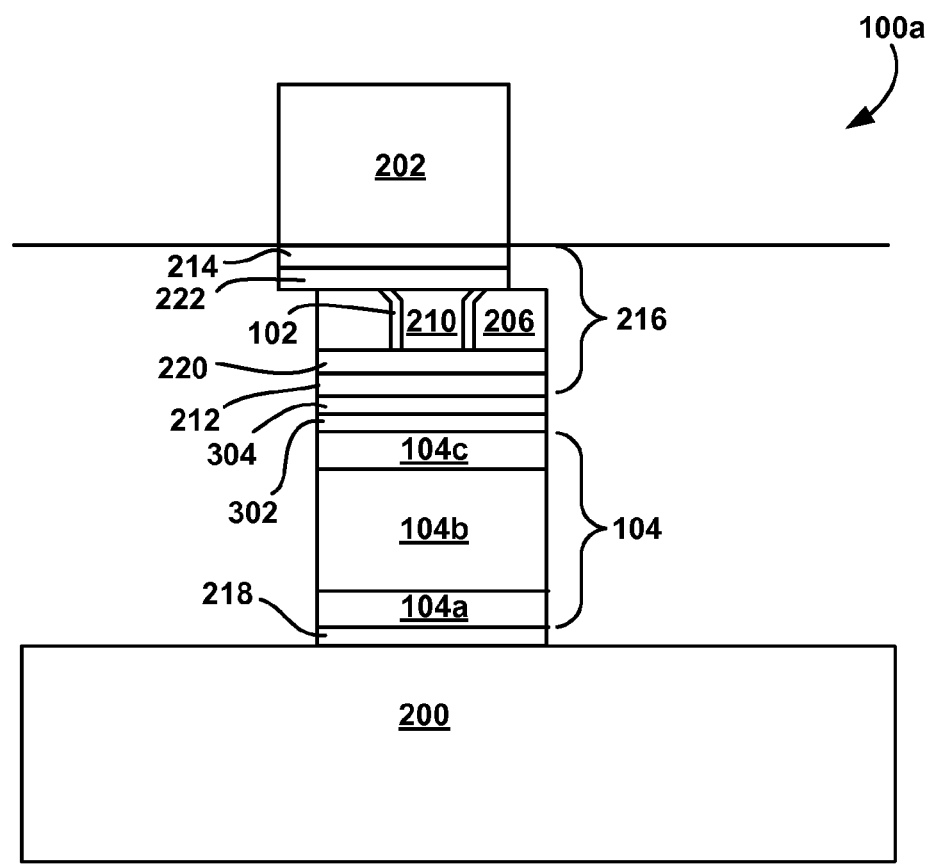
FIG. 3A is a cross-sectional view of a first additional exemplary embodiment of a memory cell in accordance with this invention.
Figure 3B:
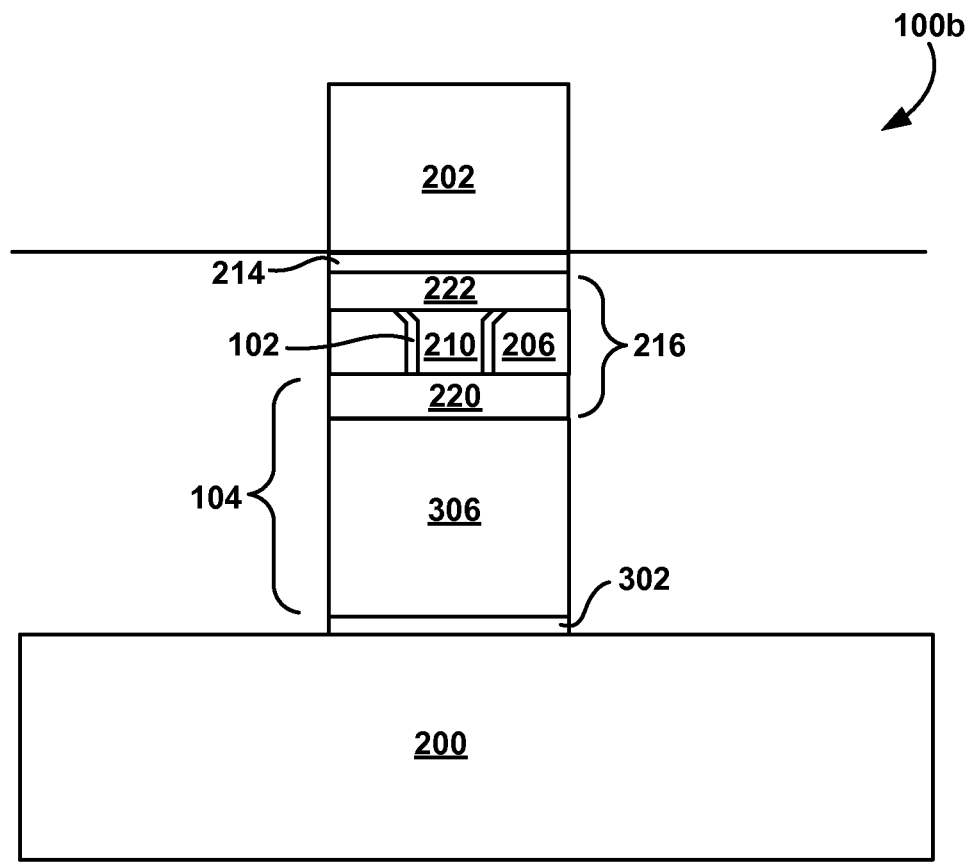
FIG. 3B is a cross-sectional view of a second additional exemplary embodiment of a memory cell in accordance with this invention.

FIG. 3A is a cross-sectional view of a first exemplary embodiment of memory cell 100 of FIG. 1, in accordance with the invention, referred to as memory cell 100a. In particular, memory cell 100a includes MIM stack 216, diode 104, and first and second conductors 200 and 202, respectively. MIM stack 216 includes C-based switching material 102, first conductive carbon layer 220, second conductive carbon layer 222 and in some embodiments barrier layer 212 and/or 214. As shown in FIG. 3A, because of the reduced geometry and location of the C-based switching material 102, a large degree of misalignment between C-based switching material 102 and conductive layers 222, 214 and/or 202 may be tolerated during memory cell fabrication. Memory cell 100b of FIG. 3B has similar advantages (although no misalignment is shown in FIG. 3B).

Referring again to FIG. 3A, in the embodiment shown, MIM stack 216 is located above diode 104. However, in other embodiments, MIM stack 216 may be located beneath diode 104. In some embodiments, diode 104 may be located remotely from MIM stack 216 (e.g., not between first and second conductors 200 and 202).

In the embodiment of FIG. 3A, diode 104 may be a vertical p-n or p-i-n diode, which may either point upward or downward. In some embodiments, diode 104 may be formed from a polycrystalline semiconductor material such as polysilicon, a polycrystalline silicon-germanium alloy, polygermanium or any other suitable material. For example, diode 104 may include a heavily doped n+ polysilicon region 104a, a lightly doped or an intrinsic (unintentionally doped) polysilicon region 104b above n+ polysilicon region 104a, and a heavily doped p+ polysilicon region 104c above intrinsic region 104b. It will be understood that the locations of the n+ and p+ regions may be reversed.

If diode 104 is fabricated from deposited silicon (e.g., amorphous or polycrystalline), a silicide layer 302 may be formed on diode 104 to place the deposited silicon in a low resistivity state, as fabricated. Such a low resistivity state allows for easier programming of memory cell 100a as a large voltage is not required to switch the deposited silicon to a low resistivity state. For example, a silicide-forming metal layer 304 such as titanium or cobalt may be deposited on p+ polysilicon region 104c and used to form silicide layer 302 (as described below). Additional process details for such an embodiment are described below with reference to FIGS. 4A-4J.

FIG. 3B is a cross-sectional view of an alternative exemplary embodiment of memory cell 100 of FIG. 1, in accordance with the invention, referred to as memory cell 100b. Memory cell 100b of FIG. 3B is similar to memory cell 100a of FIG. 3A with the exception that diode 104 of memory cell 100b is a Schottky diode rather than a p-n or p-i-n diode as in memory cell 100a of FIG. 3A. In particular, barrier layer 212 is removed and semiconductor material 306, such as n-type semiconductor material, is placed in direct contact with first conductive carbon layer 220 to form a Schottky diode 104. Additionally, silicide layer 302 is positioned below semiconductor material 306.

Use of a Schottky diode simplifies fabrication, reducing the number of steps required to form memory cell 100b and the height of memory cell 100b. In some embodiments, first and second conductive carbon layers 220 and 222, respectively, may include conductive carbon layers having primarily $sp^2$ carbon bonds (e.g., at least 50% of the carbon is $sp^2$ bonded carbon), and/or conductive metal carbide layers such as TaC, WC, TaCN, WCN, etc. First and second conductive carbon layers 220 and 222, respectively, are described further below with reference to FIGS. 4A-4J. In one exemplary embodiment, semiconductor material 306 may have a thickness of about 10 to 500 nanometers and an n-type doping concentration of about $10^{16}$ cm$^{-3}$-$10^{18}$ cm$^{-3}$, although other doping levels and/or thicknesses may be used. In some embodiments, a high doping level in the region of silicide layer 304 may be employed to form a good ohmic contact with the bottom conductor 200.

In the embodiment shown, MIM stack 216 is located above diode 104. However, in other embodiments, MIM stack 216 may be located beneath diode 104. In some embodiments, diode 104 may be located remotely from MIM stack 216 (e.g., not between first and second conductors 200 and 202). Additional process details for MIM stack 216 are provided below with reference to FIGS. 4A-4J.

Exemplary Fabrication Processes for Memory Cells

Referring now to FIGS. 4A-4J, a first exemplary method of forming a memory level in accordance with this invention is described. In particular, FIGS. 4A-4J illustrate an exemplary method of forming a memory level including memory cells 100 of FIG. 2A. As will be described below, the first memory level includes a plurality of memory cells that each include a steering element and a C-based switching material coupled to the steering element. Additional memory levels may be fabricated above the first memory level (as described previously with reference to FIGS. 2E-2F). A memory level including memory cells 100a of FIG. 3A or memory cells 100b of FIG. 3B may be formed using a similar method.

Figure 4A:
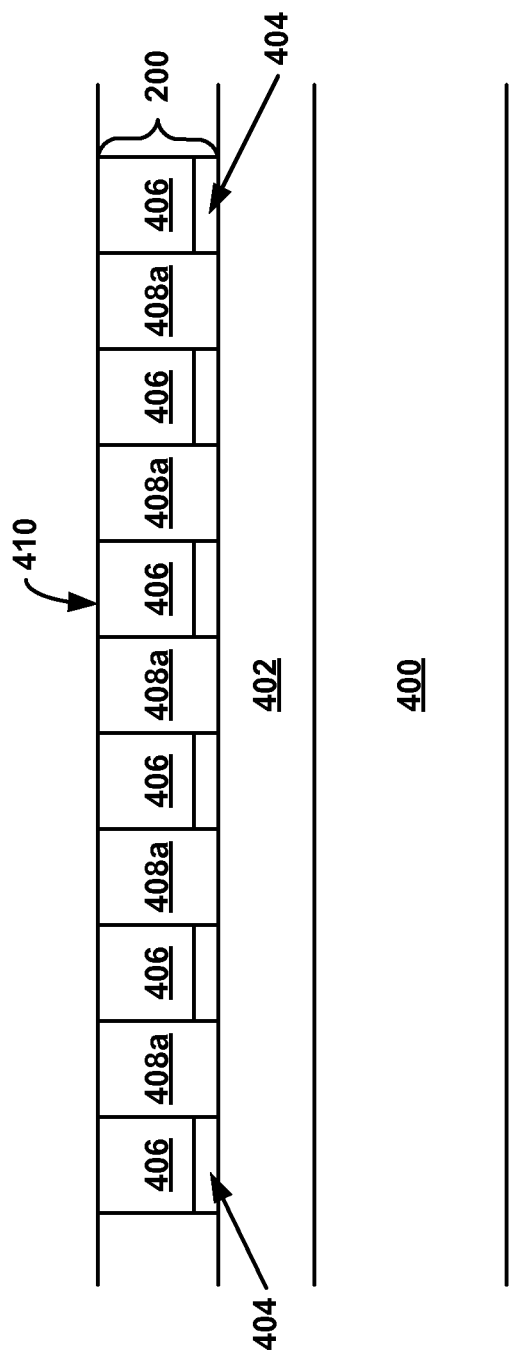
FIGS. 4A-4J illustrate cross-sectional views of a portion of a substrate during an exemplary fabrication of a single memory level in accordance with this invention.

With reference to FIG. 4A, substrate 400 is shown as having already undergone several processing steps. Substrate 400 may be any suitable substrate such as a silicon, germanium, silicon-germanium, undoped, doped, bulk, silicon-on-insulator ("SOI") or other substrate with or without additional circuitry. For example, substrate 400 may include one or more n-well or p-well regions (not shown).

Isolation layer 402 is formed above substrate 400. In some embodiments, isolation layer 402 may be a layer of silicon dioxide, silicon nitride, silicon oxynitride or any other suitable insulating layer.

Following formation of isolation layer 402, an adhesion layer 404 is formed over isolation layer 402 (e.g., by physical vapor deposition or another method). For example, adhesion layer 404 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 404 may be optional.

After formation of adhesion layer 404, a conductive layer 406 is deposited over adhesion layer 404. Conductive layer 406 may include any suitable conductive material such as tungsten or another appropriate metal, heavily doped semiconductor material, a conductive silicide, a conductive silicide-germanide, a conductive germanide, a highly conductive carbon, or the like deposited by any suitable method (e.g., chemical vapor deposition ("CVD"), physical vapor deposition ("PVD"), etc.). In at least one embodiment, conductive layer 106 may comprise about 200 to about 2500 angstroms of tungsten. Other conductive layer materials and/or thicknesses may be used.

Following formation of conductive layer 406, adhesion layer 404 and conductive layer 406 are patterned and etched. For example, adhesion layer 404 and conductive layer 406 may be patterned and etched using conventional lithography techniques, with a soft or hard mask, and wet or dry etch processing. In at least one embodiment, adhesion layer 404 and conductive layer 406 are patterned and etched to form substantially parallel, substantially co-planar first conductors 200. Exemplary widths for first conductors 200 and/or spacings between first conductors 200 range from about 200 to about 2500 angstroms, although other conductor widths and/or spacings may be used.

After first conductors 200 have been formed, a dielectric layer 408a is formed over substrate 400 to fill the voids between first conductors 200. For example, approximately 3000-7000 angstroms of silicon dioxide may be deposited on substrate 400 and planarized using chemical mechanical polishing or an etchback process to form a planar surface 410. Planar surface 410 includes exposed top surfaces of first conductors 200 separated by dielectric material (as shown). Other dielectric materials such as silicon nitride, silicon oxynitride, low k dielectrics, etc., and/or other dielectric layer thicknesses may be used. Exemplary low k dielectrics include carbon doped oxides, silicon carbon layers, or the like.

In other embodiments of the invention, first conductors 200 may be formed using a damascene process in which dielectric layer 408a is formed, patterned and etched to create openings or voids for first conductors 200. The openings or voids then may be filled with adhesion layer 404 and conductive layer 406 (and/or a conductive seed, conductive fill and/or barrier layer if needed). Adhesion layer 404 and conductive layer 406 then may be planarized to form planar surface 410. In such an embodiment, adhesion layer 404 will line the bottom and sidewalls of each opening or void.

Figure 4B:
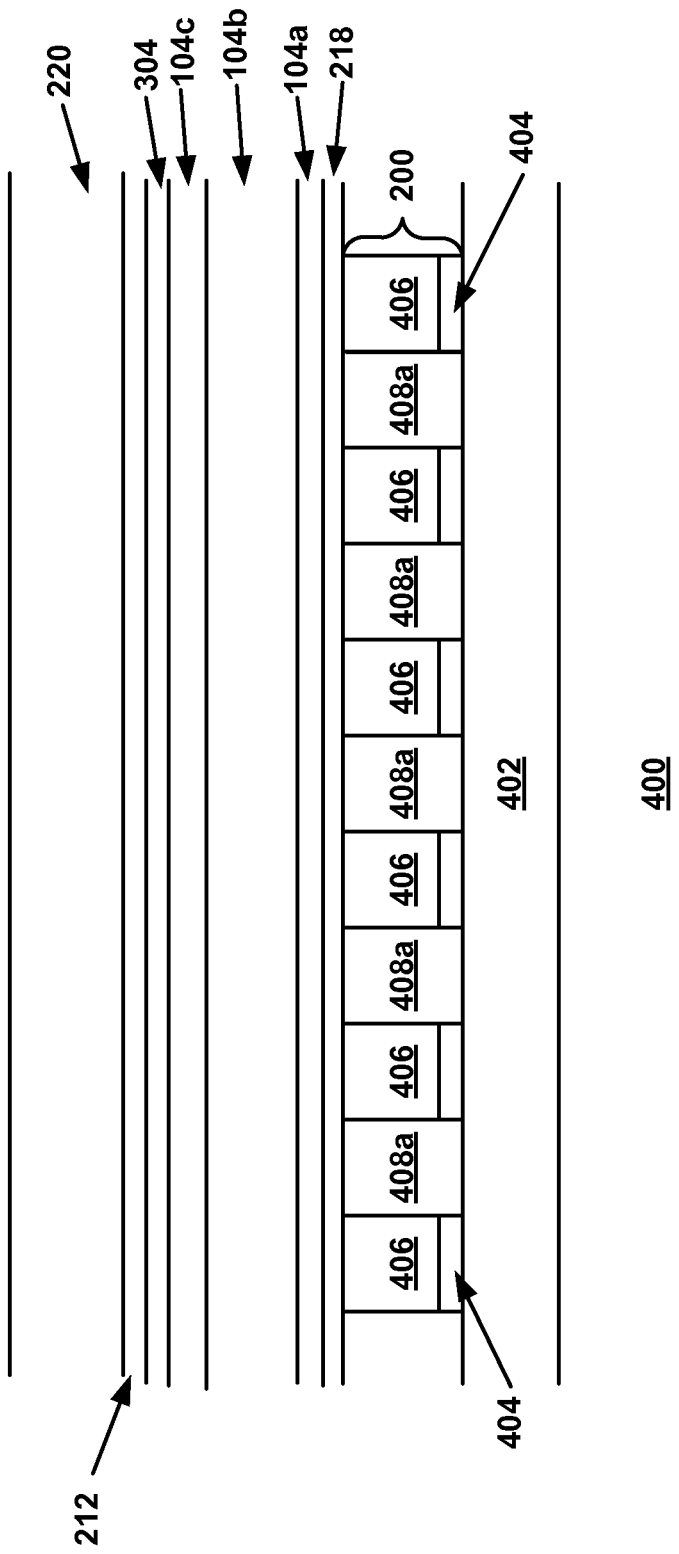

With reference to FIG. 4B, a barrier layer 218 is formed over planarized top surface 410 of substrate 400. Barrier layer 218 may be about 20 to about 500 angstroms, and preferably about 100 angstroms, of titanium, titanium nitride or another suitable barrier layer such as tantalum, tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 218, deposition of the semiconductor material used to form the diode of each memory cell begins (e.g., diode 104 in FIGS. 1 and 2A). Each diode may be a vertical upward or downward pointing p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 218, a heavily doped n+ silicon layer 104a is deposited on barrier layer 218. In some embodiments, n+silicon layer 104a is in an amorphous state as deposited. In other embodiments, n+ silicon layer 104a is in a polycrystalline state as deposited. CVD or another suitable process may be employed to deposit n+ silicon layer 104a. In at least one embodiment, n+ silicon layer 104a may be formed, for example, from about 100 to about 1000 angstroms, preferably about 100 angstroms, of phosphorus or arsenic doped silicon having a doping concentration of about $10^{21}$ cm$^{-3}$. Other layer thicknesses, doping types and/or doping concentrations may be used. N+ silicon layer 104a may be doped in situ, for example, by flowing a donor gas during deposition. Other doping methods may be used (e.g., implantation).

After deposition of n+ silicon layer 104a, a lightly doped, intrinsic and/or unintentionally doped silicon layer 104b may be formed over n+ silicon layer 104a. In some embodiments, intrinsic silicon layer 104b may be in an amorphous state as deposited. In other embodiments, intrinsic silicon layer 104b may be in a polycrystalline state as deposited. CVD or another suitable deposition method may be employed to deposit intrinsic silicon layer 104b. In at least one embodiment, intrinsic silicon layer 104b may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 104a prior to depositing intrinsic silicon layer 104b to prevent and/or reduce dopant migration from n+ silicon layer 104a into intrinsic silicon layer 104b (as described in U.S. patent application Ser. No. 11/298,331, filed Dec. 9, 2005 and titled "Deposited Semiconductor Structure To Minimize N-Type Dopant Diffusion And Method Of Making," which is hereby incorporated by reference herein in its entirety for all purposes).

Heavily doped, p-type silicon may be either deposited and doped by ion implantation or may be doped in situ during deposition to form a p+silicon layer 104c. In some embodiments, a blanket p+ implant may be employed to implant boron a predetermined depth within intrinsic silicon layer 104b. Exemplary implantable molecular ions include $BF_2$, $BF_3$, B and the like. In some embodiments, an implant dose of about $1-5\times10^{15}$ ions/cm$^2$ may be employed. Other implant species and/or doses may be used. Further, in some embodiments, a diffusion process may be employed. In at least one embodiment, the resultant p+ silicon layer 104c has a thickness of about 100-700 angstroms, although other p+ silicon layer sizes may be used.

Following formation of p+ silicon layer 104c, a silicide-forming metal layer 304 is deposited over p+ silicon layer 104c. Exemplary silicide-forming metals include sputter or otherwise deposited titanium or cobalt. In some embodiments, silicide-forming metal layer 304 has a thickness of about 10 to about 200 angstroms, preferably about 20 to about 50 angstroms and more preferably about 20 angstroms. Other silicide-forming metal layer materials and/or thicknesses may be used. A nitride layer (not shown) may be formed at the top of silicide-forming metal layer 304.

A rapid thermal anneal ("RTA") step may be performed to form silicide regions by reaction of silicide-forming metal layer 304 with p+ region 104c. In some embodiments, the RTA may be performed at about 540° C. for about 1 minute, and causes silicide-forming metal layer 304 and the deposited silicon of diode 104 to interact to form a silicide layer, consuming all or a portion of silicide-forming metal layer 304. Following the RTA step, any residual nitride layer from silicide-forming metal layer 304 may be stripped using a wet chemistry. For example, if silicide-forming metal layer 304 includes a TiN top layer, a wet chemistry (e.g., ammonium, peroxide, water in a 1:1:1 ratio) may be used to strip any residual TiN.

As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., a silicide layer enhances the crystalline structure of silicon diode 104 during annealing). Lower resistivity silicon thereby is provided. Similar results may be achieved for silicon-germanium alloy and/or germanium diodes.

Following the RTA step and the nitride strip step, a barrier layer 212 is formed above silicide-forming metal layer 304. Barrier layer 212 may be about 5 to about 800 angstroms, and preferably about 100 angstroms, of titanium nitride or another suitable barrier layer such as titanium, tantalum, tantalum nitride, tungsten, tungsten nitride, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

Following formation of barrier layer 212, first conductive carbon layer 220 is formed. For example, following formation of barrier layer 212, an amorphous carbon layer may be deposited over barrier layer 212 (e.g., by plasma enhanced chemical vapor deposition ("PECVD")), implanted with nitrogen or boron and/or annealed to form a conductive carbon layer having primarily sp$^2$ bonded carbon that serves as first conductive carbon layer 220. First conductive carbon layer 220 may have a thickness of about 10-200 nanometers, and in some embodiments about 50-100 nanometers. Exemplary resistivity values for first conductive carbon layer 220 range from about $50\times10^{-6}$ ohm-cm-$100\times10^{-3}$ ohm-cm, and in some embodiments about $1\times10^{-3}$-$10\times10^{-3}$ ohm-cm. Other thicknesses and/or resistivity values may be used.

In other embodiments, first conductive carbon layer 220 may comprise a metal carbide. A metal carbide conductive carbon layer may be formed, for example, by sputtering a suitable carbide target. Exemplary carbide layers that may be used as first conductive carbon layer 220 include TaC, WC, TaCN, WCN, or the like. Exemplary thickness ranges for such metal carbide layers range from about 1-200 nanometers, and in some embodiments from about 1-20 nanometers. Exemplary resistivity values range from about $50\times10^{-6}$ ohm-cm-$100\times10^{-3}$ ohm-cm, and in some embodiments about $1\times10^{-4}$-$10\times10^{-4}$ ohm-cm. Other resistivity values may be used.

Table 1 provides exemplary process parameters for formation of a metal carbide layer that may be used as first conductive carbon layer 220 (or second conductive carbon layer 222). Other flow rates, pressures, temperatures, powers and/or spacings may be used.

TABLE 1

EXEMPLARY PROCESS PARAMETERS FOR SPUTTERING METAL CARBIDE TARGET

| PROCESS PARAMETER | 1$^{ST}$ EXAMPLE RANGE | 2$^{ND}$ EXAMPLE RANGE |
|---|---|---|
| ARGON FLOW (SCCM) | 5-100 | 8-15 |
| PRESSURE (milliTorr) | 0.6-40 | 2-8 |
| SUBSTRATE TEMP (° C.) | 200-550 | 200-550 |
| TARGET RF POWER (WATTS/CM$^2$ @ 13.56 MHZ) | 1-3.5 | 1-3.5 |
| TARGET-SUBSTRATE SPACING (mm) | 22-37 | 22-37 |

A thin (e.g., 1-200 nm) polysilicon layer is deposited on the metal carbide layer as a sacrificial layer, which subsequently will be etched away to expose the metal carbide surface for a spacer deposition. Other sacrificial materials like carbon, oxides, nitrides can be used and subsequently etched away, so that the required recess is formed.

Following formation of the first conductive carbon layer 220, first conductive carbon layer 220, barrier layer 212, silicide-forming metal layer 304, diode layers 104a-c and barrier layer 218 are patterned and etched into pillars 410

Figure 4C:
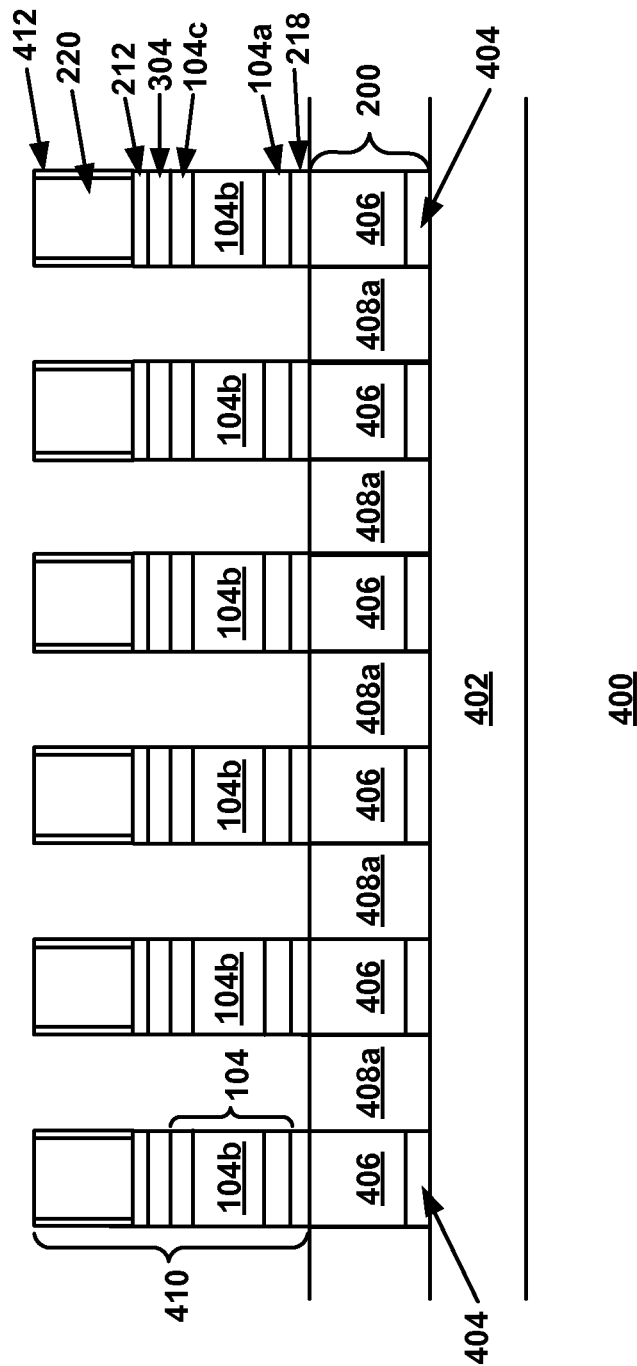
Figure 4D:
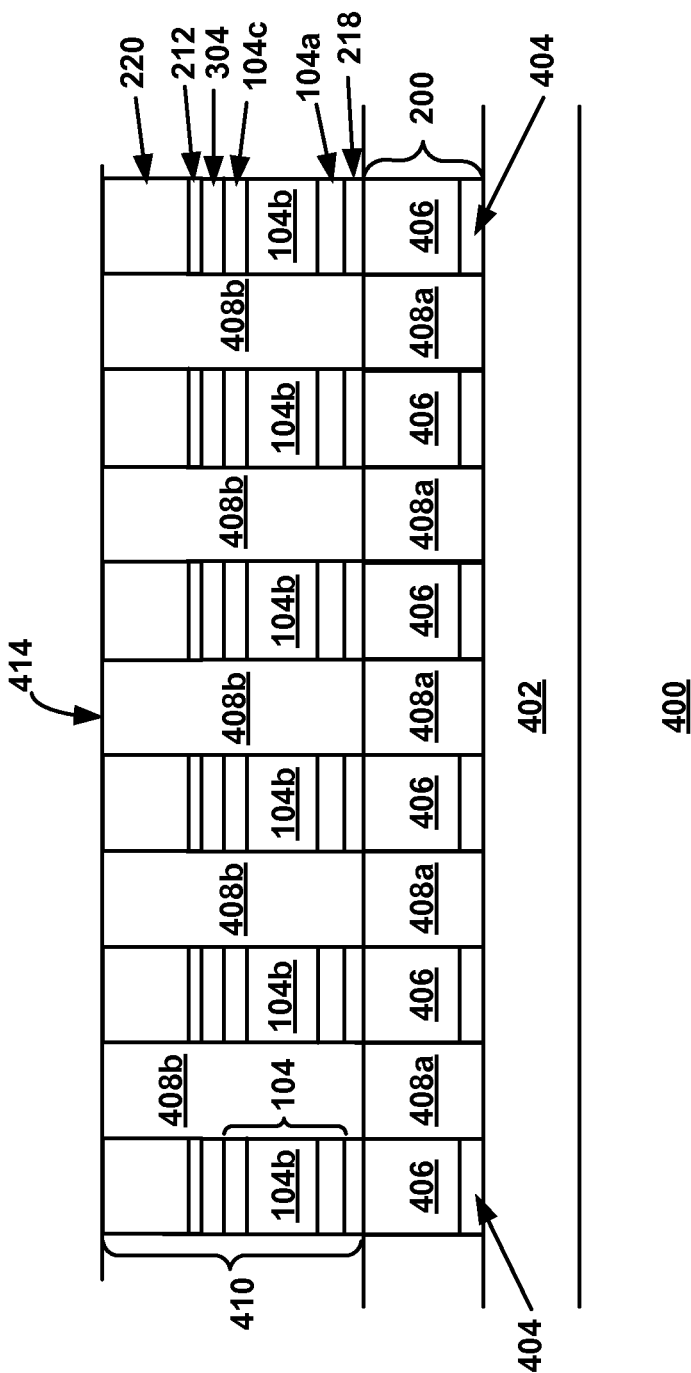

(FIG. 4C). In some embodiments, pillars 410 may have about the same pitch and about the same width as conductors 200 below, such that each pillar 410 is formed on top of a conductor 200. Some misalignment may be tolerated.

In at least one embodiment, a hard mask layer (not shown), such as about 100-500 nanometers of silicon nitride, silicon oxide or the like, may be deposited over the first conductive carbon layer 220. Thinner or thicker hard mask layers may be used with smaller critical dimensions and technology nodes. Photoresist may be deposited and patterned using standard photolithography techniques. The hard mask layer then may be etched to expose first conductive carbon layer 220 in regions in which first conductive carbon layer 220 is to be etched during formation of pillars 410. After etching/patterning of the hard mask, the photoresist may be removed and layers 218, 104a-104c, 304, 212 and 220 then may be etched. (Note that use of a hard mask reduces exposure of conductive carbon layer 220 to an oxygen plasma that may be employed during photoresist removal/asking).

In some embodiments, the hard mask may be formed on top of first conductive carbon layer 220, with bottom antireflective coating ("BARC") on top, then patterned and etched. Similarly, dielectric antireflective coating ("DARC") may be used as a hard mask.

Pillars 410 may be formed using any suitable masking and etching process. Any suitable etch chemistries, and any suitable etch parameters, flow rates, chamber pressures, power levels, process temperatures, and/or etch rates may be used. In some embodiments, first conductive carbon layer 220, barrier layer 212, silicide-forming metal layer 304, diode layers 104a-104c and barrier layer 218 may be patterned using a single etch step. In other embodiments, separate etch steps may be used. The etch proceeds down to dielectric layer 408a.

In one particular embodiment, an oxygen plasma may be used to etch the first conductive carbon layer 220 (stopping on barrier layer 212, silicide-forming metal layer 304 or diode region 104c). Table 2 provides exemplary oxygen plasma process parameters for etching first conductive carbon layer 220. Other flow rates, pressures, temperatures, powers and/or spacings may be used.

TABLE 2

EXEMPLARY OXYGEN PLASMA ETCH PARAMETERS

| PROCESS PARAMETER | $1^{ST}$ EXAMPLE RANGE | $2^{ND}$ EXAMPLE RANGE |
|---|---|---|
| CO FLOW RATE (sccm) | 50-500 | 250-350 |
| $O_2$ FLOW RATE (sccm) | 5-50 | 25-35 |
| $N_2$ FLOW RATE (sccm) | 10-200 | 80-120 |
| PRESSURE (mTorr) | 5-100 | 50-60 |
| RF POWER (watts) | 20-500 | 150-250 |
| SUBSTRATE TEMP (° C.) | 20-200 | 40-60 |

Thereafter, a thin dielectric liner 412 may be deposited on the exposed sidewalls of first conductive carbon layer 220, and the remaining memory cell layers may be etched down to the dielectric layer 408a as shown in FIG. 4C. In some embodiments, dielectric liner 412 may include about 1-10 nanometers, and in some embodiments 2-5 nanometers, of conformal silicon nitride. Other dielectric liner materials and/or thicknesses may be employed. In other embodiments, dielectric liner 412 may be eliminated. For convenience, dielectric liner 412 is not shown in FIGS. 4D-4J.

After etching, pillars 410 may be cleaned using a dilute hydrofluoric/sulfuric acid clean. Such cleaning, whether or not PR asking is performed before etching, may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt %) for 60 seconds. Megasonics may or may not be used.

After pillars 410 have been cleaned, a dielectric layer 408b may be deposited over pillars 410 to fill the voids between pillars 410. For example, approximately 200-7000 angstroms of silicon dioxide may be deposited and planarized using chemical mechanical polishing or an etchback process to remove excess dielectric material 408b and form a planar surface 414, resulting in the structure illustrated in FIG. 4D. Planar surface 414 includes exposed regions of first conductive carbon layer 220 separated by dielectric material 408b (as shown). Other dielectric materials such as silicon nitride, silicon oxynitride, low k dielectrics, etc., and/or other dielectric layer thicknesses may be used.

Figure 4E:
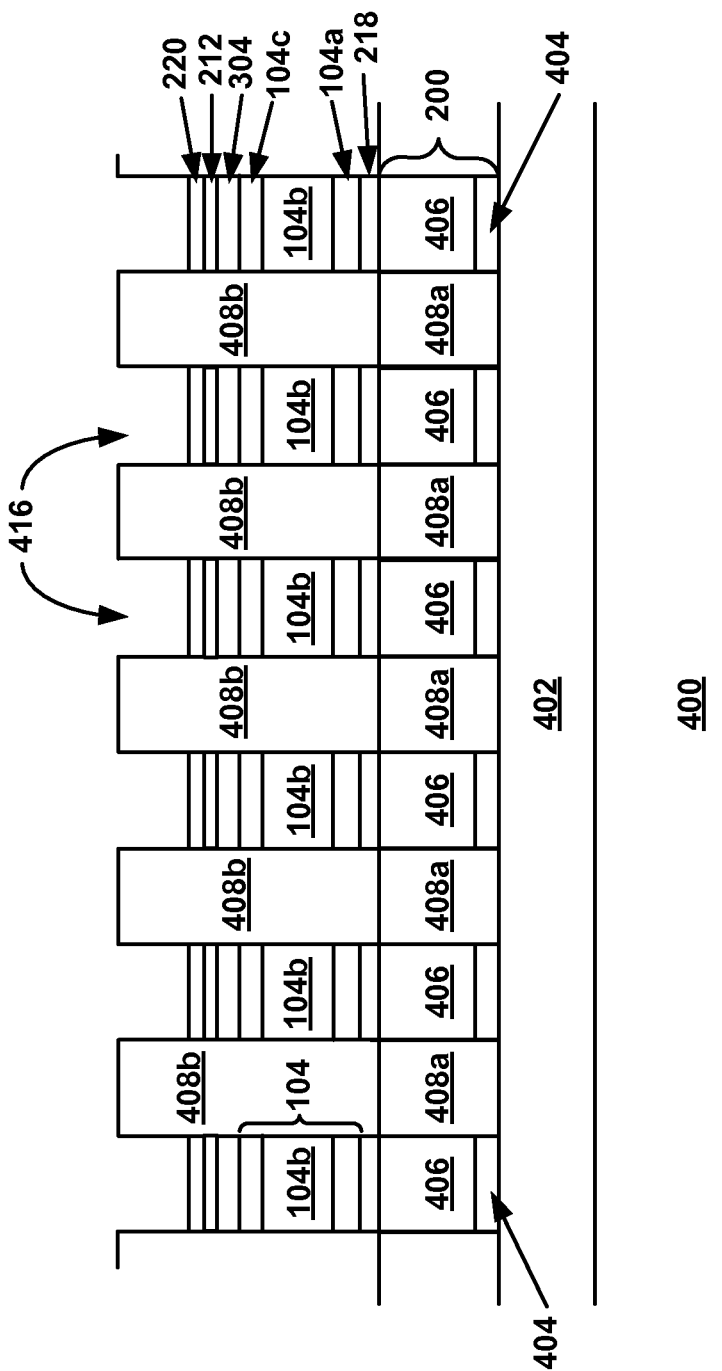

With reference to FIG. 4E, following formation of the planar surface 414, a portion of the first conductive carbon layer 220 is removed to form first openings 416 having sidewalls defined by dielectric material 408b. In some embodiments, an oxygen plasma or other etchback process may be employed to selectively remove a top portion of first conductive carbon layer 220. For example, a top portion of first conductive carbon layer 220 may be etched with a mixture of between about 250-350 sccm CO, 25-35 sccm $O_2$, 80-120 sccm $N_2$ at about 50-60 mTorr with about 150-250 Watt RF power, and a wafer temperature of about 40-60° C.

In one or more embodiments, following such removal, approximately 1-100 nanometers, and in some embodiments 1-20 nanometers, of first conductive carbon layer 220 may remain (depending on the diameter of first openings 416). More generally, about 50-90%, and in some embodiments about 70-80%, of first conductive carbon layer 220 may be removed so that about 10%-50%, in some embodiments about 20-30%, of first conductive carbon layer 220 remains.

Figure 4F:
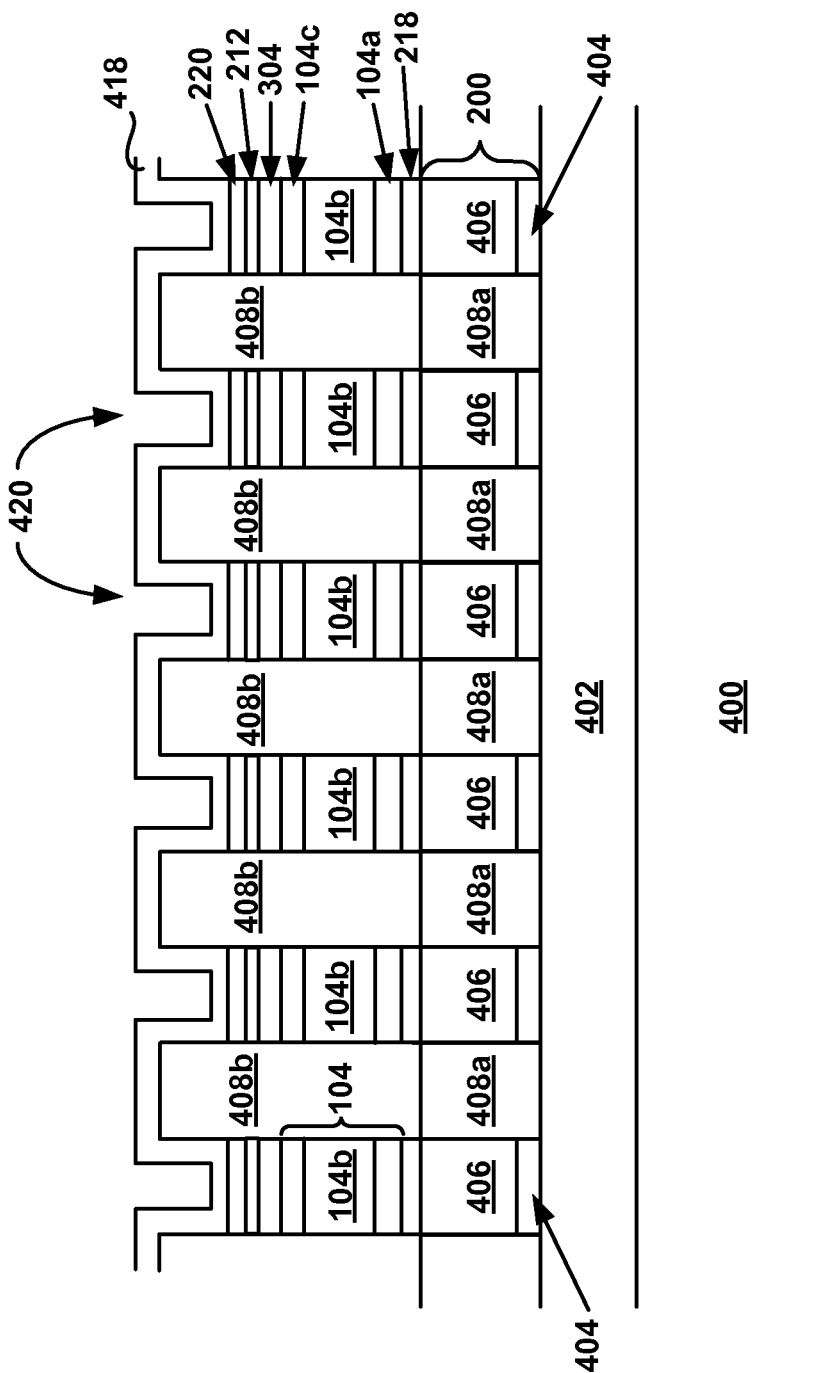

Following formation of first openings 416, a dielectric spacer material 418 is formed within first openings 416 to define narrower, second openings 420 as shown in FIG. 4F. In some embodiments, dielectric spacer material 418 may include silicon nitride, silicon oxide, silicon carbide, combinations of the same such as an oxide/nitride stack or other dielectrics having a sidewall thickness of about 20-40%, and in some embodiments about 28-35%, of the diameter of first openings 416. For example, for a first opening diameter of 43 nanometers, a sidewall spacer thickness of about 13 nanometers may be used. For a first opening diameter of 20 nanometers, a sidewall spacer thickness of about 7.1 nanometers may be used. For a first opening diameter of 15 nanometers, a sidewall spacer thickness of about 5.5 nanometers may be used. Other spacer materials and/or thicknesses may be used. Note that for each of these configurations, use of a C-based switching material 102 having a thickness between about 1-2 nanometers on sidewalls of a spacer in an opening 416 provides an approximately 15 or more reduction in cross-sectional area for C-based switching material 102 compared to that of opening 416 (FIG. 4E), resulting in a compression of 15 or more in current density.

Figure 4G:
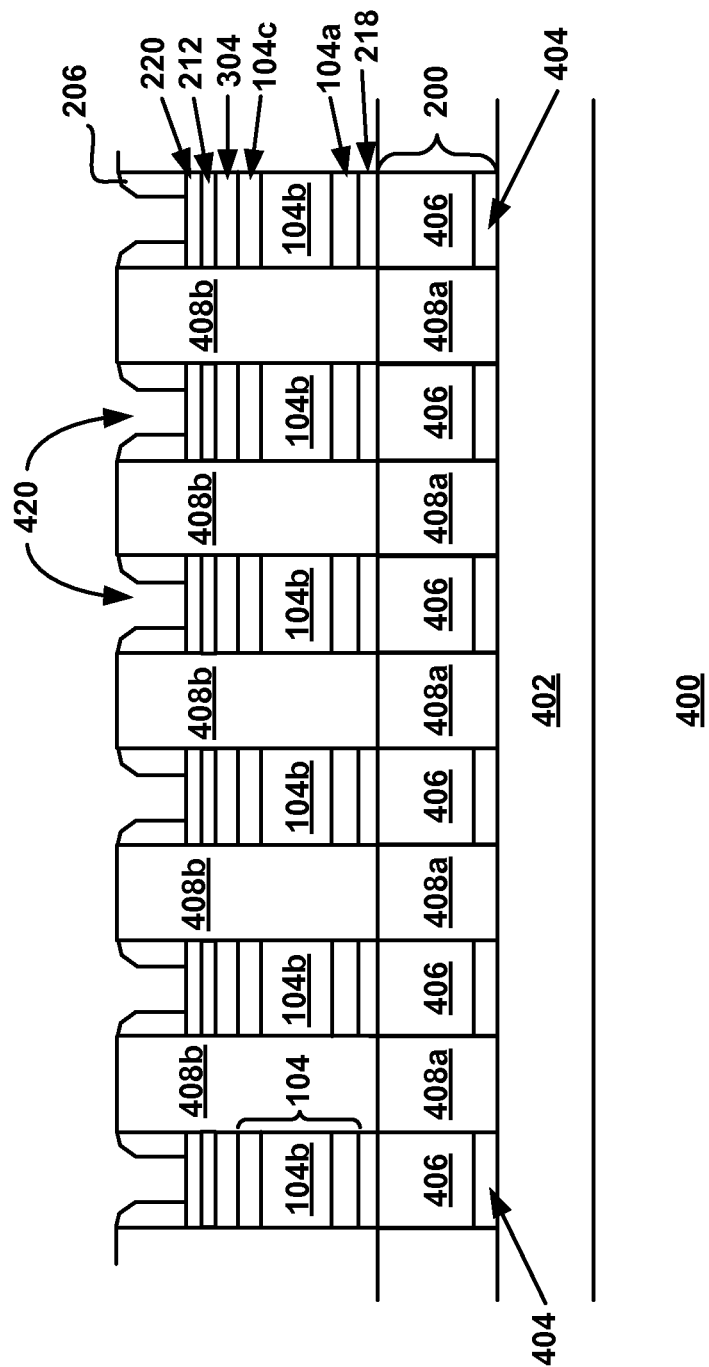

With reference to FIG. 4G, after formation of dielectric spacer material 418, an etchback process may be performed to expose first conductive carbon layer 220 in each opening 416 (FIG. 4E) and remove dielectric spacer material from the field (top) regions of the dielectric material 408b. For example, a wet or dry etch process may be used to remove spacer material 418 from first conductive carbon layer 220 and field regions of dielectric material 408b. Dielectric spacers 206 thereby are formed from dielectric spacer material 418. Over etch of spacer material 418 is well tolerated by the carbon material and the subsequent process flow.

Table 3 provides exemplary process parameters for etching dielectric spacer material 418. Other gases, flow rates, pressures, temperatures, and/or powers may be used.

TABLE 3

EXEMPLARY PROCESS PARAMETERS FOR DIELECTRIC SPACER ETCH

| PROCESS PARAMETER | 1$^{st}$ EXAMPLE RANGE | 2$^{nd}$ EXAMPLE RANGE |
|---|---|---|
| Cl$_2$ flow rate (sccm) | 50-200 | 80-110 |
| He flow rate (sccm) | 0-200 | 0-5 |
| HBr flow rate (sccm) | 10-500 | 160-190 |
| Pressure (mTorr) | 4-90 | 8-12 |
| Backside cooling He pressure (Torr) | 4-10 | 4-6 |
| RF Power (Watts) | 5-300 | 80-110 |

Figure 4H:
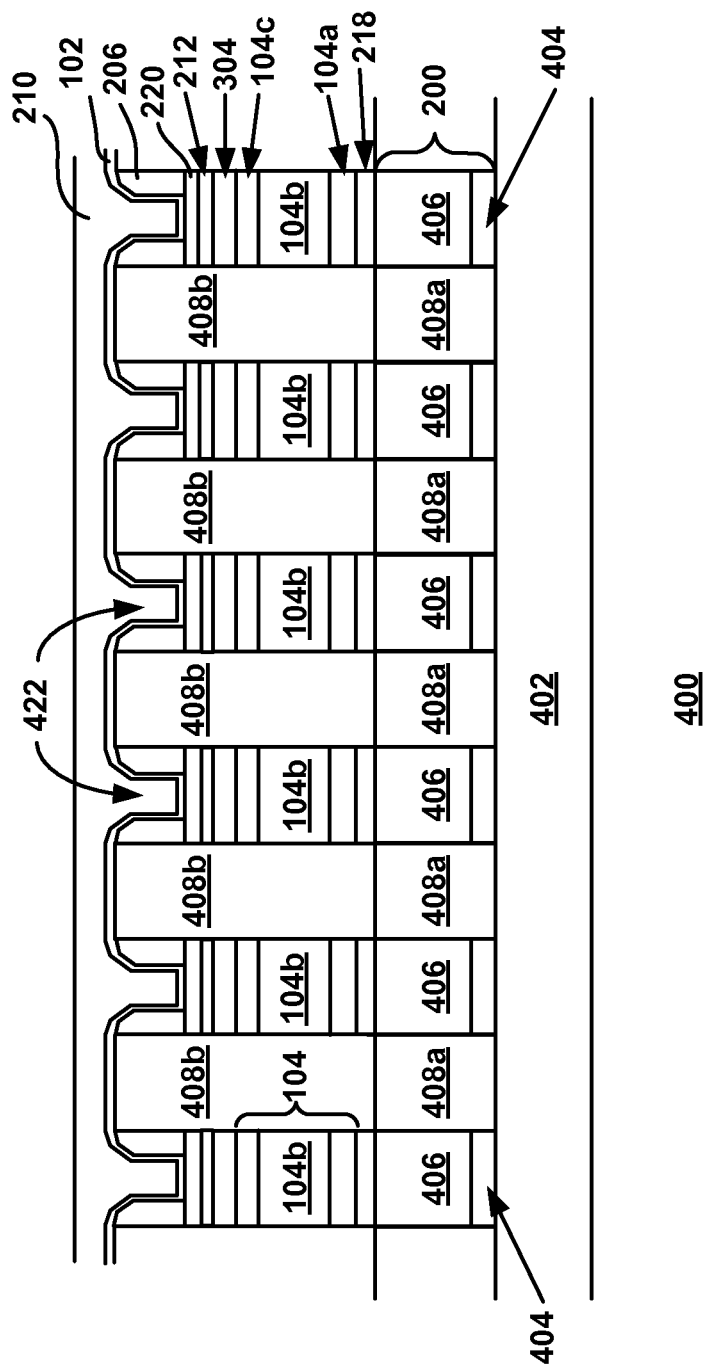

With reference to FIG. 4H, following formation of dielectric spacers 206, a C-based switching material 102 is formed in second openings 420 on the sidewalls of spacers 206 (forming third openings 422). For example, C-based switching material 102 may be formed using the same or a similar process used to form first conductive carbon layer 220, such as using PECVD to form an amorphous carbon layer. If desired, C-based switching material 102 may be implanted with nitrogen or boron and/or annealed to form a conductive carbon layer having primarily sp$^2$ bonded carbon. However, using a higher resistivity film (described below) for C-based switching material 102 may allow a thicker film (e.g., larger cross sectional area film) to be used.

Silicon Implant to Form Carbon Switching Layer

In some embodiments, C-based switching material 102 may be formed by depositing a low-hydrogen, conductive carbon layer and then implanting silicon into the layer to form a low-hydrogen, silicon-containing carbon switching material 102. For example, about 0.5-5 nm, and in some embodiments 1-2 nanometers, of amorphous carbon may be deposited over first conductive carbon layer 220, such as by PECVD using C$_2$H$_2$ gas at about 550° C. and about 5 Torr pressure. Other precursors, temperatures and/or pressures may be used. An RTA then may be performed on the amorphous carbon film to convert the carbon film to primarily sp$^2$ bonded carbon having a lower resistivity and to outgas hydrogen from the film. Exemplary anneal conditions include rapid thermal annealing at about 700° C. for about 60 seconds, although other temperatures and/or times may be used. Other deposition techniques may be used to form the low-hydrogen carbon layer, such as sputtering a graphite target.

Dopants such as nitrogen or boron may be included in the carbon layer. For example, nitrogen may implanted at an energy of about 2.8 kV with a dose between about 1×10$^{16}$-6×10$^{16}$ atoms/cm$^2$, 2.4×10$^{16}$ atoms/cm$^2$ in some embodiments and in the range of 1-5 atm %. Boron may implanted at an energy of about 3 kV with a dose between about 1×10$^{16}$-6×10$^{16}$ atoms/cm$^2$, 2.5×10$^{16}$ atoms/cm$^2$ in some embodiments, and in the range of 1-5 atm %. Other dopants, implant energies and/or implant doses may be used. In some embodiments, the resultant film will have a resistivity of not more than about 50×10$^{-6}$ ohm-cm-100×10$^{-3}$ ohm-cm, and in some embodiments about 1×10$^{-3}$-10×10$^{-3}$ ohm-cm. Other resistivity values may be used.

Following formation of the carbon layer, silicon may be implanted into the carbon layer to form a low-hydrogen, silicon-containing carbon layer (C-based switching material 102). For instance, about 1×10$^{15}$-3×10$^{18}$ atoms/cm$^2$, and in some embodiments about 1×10$^{17}$-1×10$^{18}$ atoms/cm$^2$ of silicon may be implanted into the carbon layer at an energy between about 1.5-5 kV, or 2.5-2.8 kV in other embodiments. A post implant anneal is optional. Implanting the silicon into the carbon layer creates a region of higher resistivity material that may include a silicon content from about 0.0001-60 atm %, and in some embodiments about 30-40 atm % in at least some portion of the carbon layer. The silicon may or may not be distributed uniformly. In some embodiments, only about 1-5 nanometers of the carbon layer may include 30-40 atm % or more of silicon, while the remainder of the layer may comprise more, less or no silicon.

The resistivity of C-based switching material 102 may range from about 10-1×10$^8$ ohm-cm, and in some embodiments 1×10$^3$-1×10$^5$ ohm-cm. In other embodiments, the resistivity of C-based switching material 102 may range from about 1×10$^{-3}$ to 1 ohm-cm. Other thicknesses, amounts of silicon and/or resistivities may be used. C-based switching material 102 may have a hydrogen content of less than about 10%, in some embodiments less than about 5% and in some embodiments between about 1-5%.

Sputter Formed Carbon Switching Layer

In other embodiments, C-based switching material 102 may be formed over first conductive carbon layer 220 by sputtering a graphite target (see Table 4 below) to form a low-hydrogen carbon switching layer. If desired, silicon may be implanted into the carbon layer to form a low-hydrogen, silicon-containing carbon layer that serves as C-based switching material 102. Silicon implant doses and energies similar to those described previously may be employed.

Alternatively, a low-hydrogen, silicon-containing carbon layer may be formed by sputtering a silicon carbide target (see Table 5 below) or sputtering a silicon target in the presence of a carbon-containing gas such as CH$_4$ or another similar gas (see Table 6 below). Tables 4-6 provide exemplary process parameters for formation of a low-hydrogen carbon film that may be used as a C-based switching material. Other flow rates, pressures, temperatures, powers and/or spacings may be used.

TABLE 4

EXEMPLARY PROCESS PARAMETERS FOR SPUTTERING GRAPHITE TARGET

| PROCESS PARAMETER | 1$^{ST}$ EXAMPLE RANGE | 2$^{ND}$ EXAMPLE RANGE |
|---|---|---|
| ARGON FLOW (SCCM) | 5-100 | 8-15 |
| PRESSURE (milliTorr) | 0.6-40 | 2-8 |
| SUBSTRATE TEMP (° C.) | 200-550 | 200-550 |
| TARGET RF POWER (WATTS/CM$^2$ @ 13.56 MHZ) | 1-3.5 | 1-3.5 |
| TARGET-SUBSTRATE SPACING (mm) | 22-37 | 22-37 |

TABLE 5

EXEMPLARY PROCESS PARAMETERS FOR SPUTTERING SiC TARGET

| PROCESS PARAMETER | 1$^{ST}$ EXAMPLE RANGE | 2$^{ND}$ EXAMPLE RANGE |
|---|---|---|
| ARGON FLOW (SCCM) | 5-100 | 8-15 |
| PRESSURE (milliTorr) | 0.6-40 | 2-8 |
| SUBSTRATE TEMP (° C.) | 200-550 | 200-550 |

TABLE 5-continued

EXEMPLARY PROCESS PARAMETERS FOR SPUTTERING SiC TARGET

| PROCESS PARAMETER | $1^{ST}$ EXAMPLE RANGE | $2^{ND}$ EXAMPLE RANGE |
|---|---|---|
| TARGET RF POWER (WATTS/CM$^2$ @ 13.56 MHZ) | 1-3.5 | 1-3.5 |
| TARGET-SUBSTRATE SPACING (mm) | 22-37 | 22-37 |

TABLE 6

EXEMPLARY PROCESS PARAMETERS FOR SPUTTERING Si TARGET

| PROCESS PARAMETER | $1^{ST}$ EXAMPLE RANGE | $2^{ND}$ EXAMPLE RANGE |
|---|---|---|
| ARGON FLOW (SCCM) | 5-100 | 8-15 |
| CH$_4$ FLOW (SCCM) | 0.1-100 | .1-3 |
| PRESSURE (milliTorr) | 0.6-40 | 2-8 |
| SUBSTRATE TEMP (° C.) | 200-550 | 200-550 |
| TARGET RF POWER (WATTS/CM$^2$ @ 13.56 MHZ) | 1-3.5 | 1-3.5 |
| TARGET-SUBSTRATE SPACING (mm) | 22-37 | 22-37 |

Following formation of C-based switching material 102, a dielectric layer 210 may be deposited over C-based switching material 102 to fill third openings 422 (FIG. 4H). For example, approximately 200-7000 angstroms of silicon dioxide may be deposited and planarized using chemical mechanical polishing or an etchback process to remove excess dielectric material 210 and excess C-based switching material 102, and to form a planar surface 424, resulting in the structure illustrated in FIG. 4I-1. Planar surface 424 includes exposed regions of C-based switching material 102 separated by dielectric material 408b and 210 (as shown). Other dielectric materials such as silicon nitride, silicon oxynitride, low k dielectrics, etc., and/or other dielectric layer thicknesses may be used.

Figures 1, 4I:
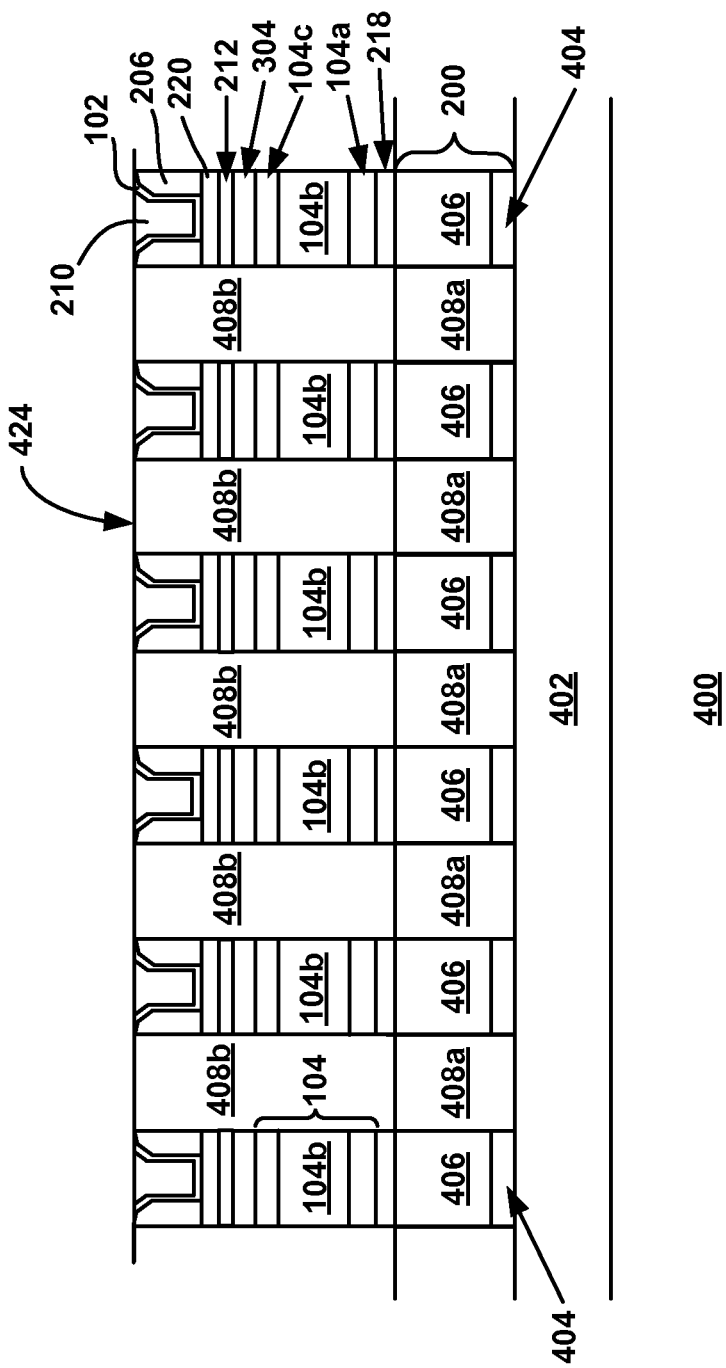
Figures 2, 4I:
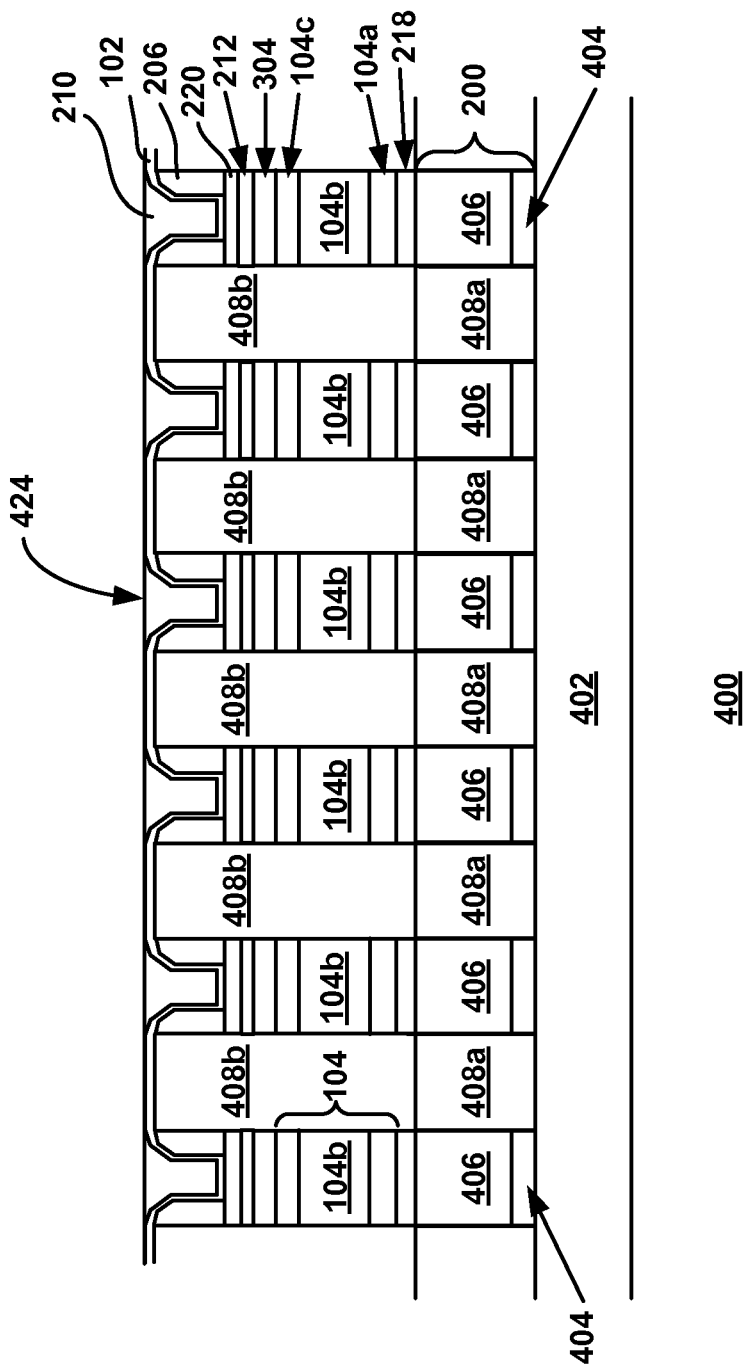

In an alternative embodiment shown in FIG. 4I-2, chemical mechanical polishing ("CMP") may be used to remove excess dielectric material 210 without removing C-based switching material 102 from the field regions of dielectric 408b. Carbon is known to be an excellent stopping layer for CMP. In such an embodiment, surface 424 includes exposed regions of C-based switching material 102 separated by dielectric material 210 (as shown in FIG. 4I-2).

Second conductive carbon layer 222 is formed over C-based switching material 102. Second conductive carbon layer 222 may be similar to first conductive carbon layer 220 (and similarly formed). For example, second conductive carbon layer 222 may comprise an amorphous carbon layer deposited over C-based switching material 102 (e.g., by PECVD), implanted with nitrogen or boron and/or annealed to form a conductive carbon layer having primarily sp$^2$ bonded carbon that serves as second conductive carbon layer 222. Second conductive carbon layer 222 may have a thickness of about 1-100 nanometers, and in some embodiments about 5-20 nanometers. Exemplary resistivity values for second conductive carbon layer 222 range from about $50 \times 10^{-6}$ ohm-cm-$100 \times 10^{-3}$ ohm-cm, and in some embodiments about $1-10 \times 10^{-3}$ ohm-cm. Other thicknesses and/or resistivity values may be used.

In other embodiments, second conductive carbon layer 222 may comprise a metal carbide. A metal carbide, conductive carbon layer may be formed, for example, by sputtering a suitable carbide target. Exemplary carbide layers that may be used as second conductive carbon layer 222 include TaC, WC, TaCN, WCN, or the like. Exemplary thicknesses ranges for such metal carbide layers range from about 1-100 nanometers, and in some embodiments about 2-10 nanometers. Exemplary resistivity values range from about $50 \times 10^{-6}$ ohm-cm-$100 \times 10^{-3}$ ohm-cm, and in some embodiments from about $1-10 \times 10^{-4}$ ohm-cm. Other thicknesses and/or resistivity values may be used.

First conductive carbon layer 220 and second conductive carbon layer 222 serve as high current density sustaining electrodes for MIM stack 216 (FIG. 2A). First and second conductive carbon layers 220 and 222 allow high current densities produced during switching of C-based switching material 102 to be distributed safely to metallization layers used in memory cell 100 such as barrier layers 214 and 212, as well as top conductor 202.

Figures 1, 4J:
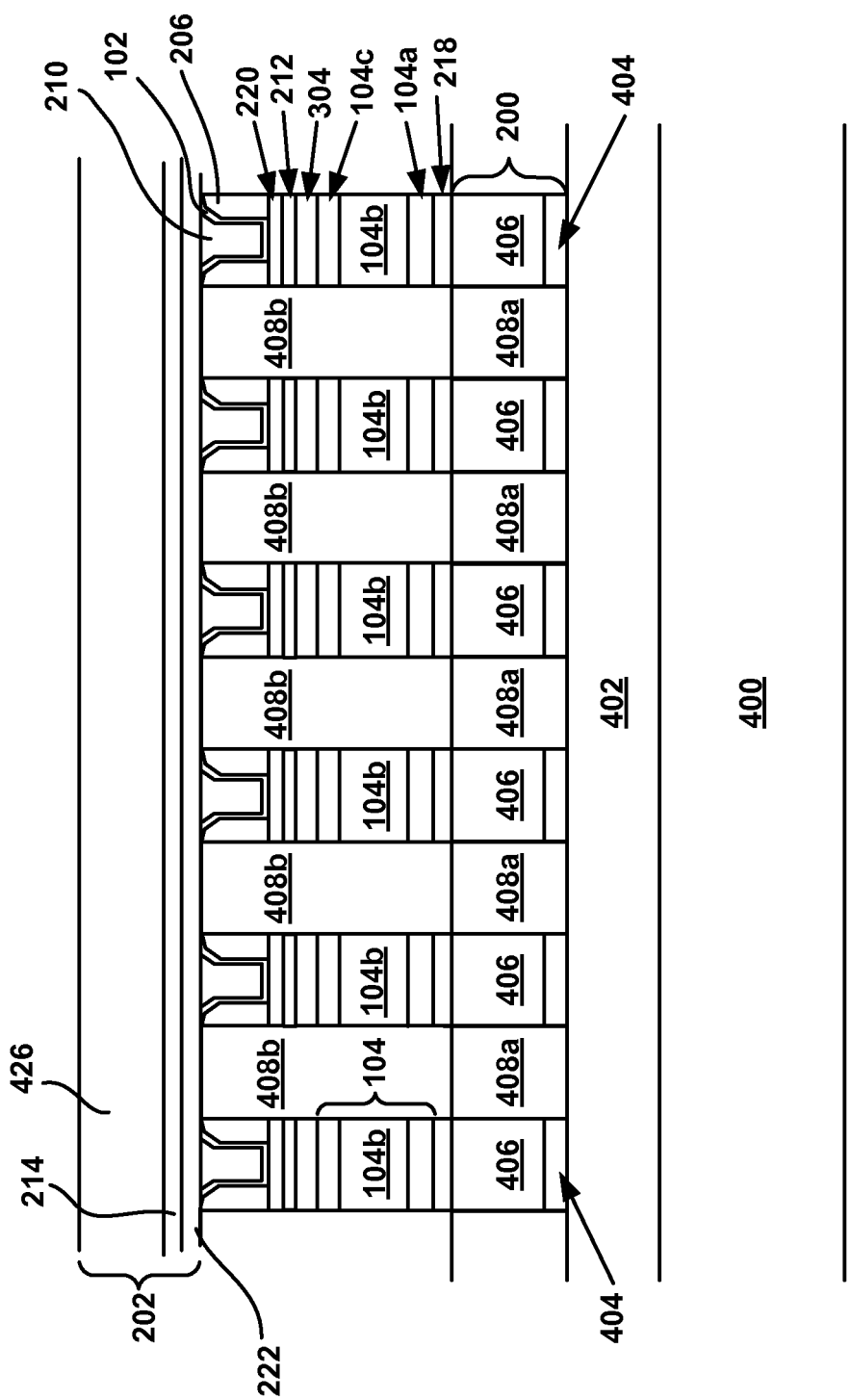
Figures 2, 4J:
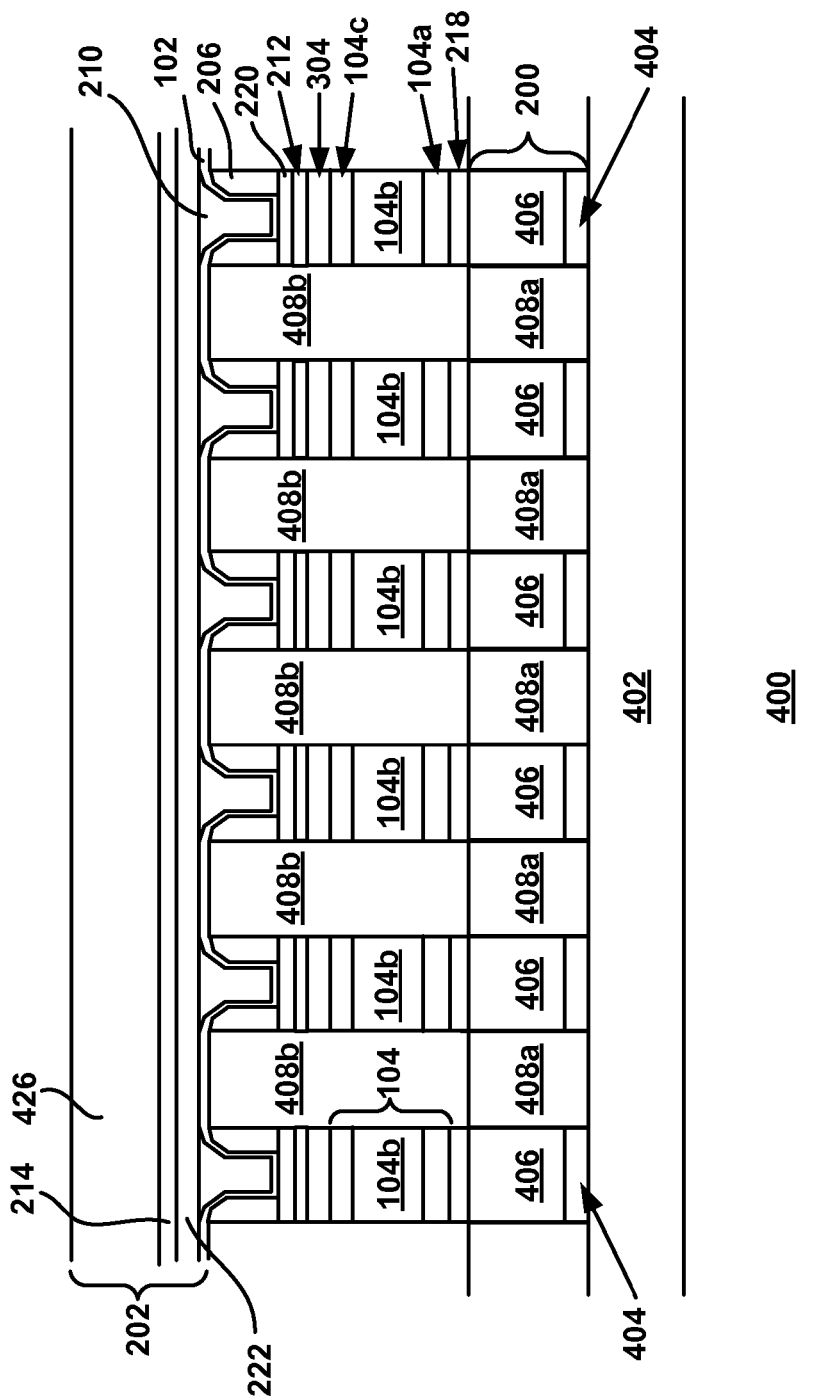

With reference to FIG. 4J-1, second conductors 202 may be formed above pillars 410 in a manner similar to the formation of first conductors 200. For example, in some embodiments, one or more barrier layers and/or adhesion layers 214 may be deposited over pillars 410 prior to deposition of a conductive layer 426 used to form second conductors 202.

Conductive layer 426 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Other conductive layer materials may be used. Barrier layer and/or adhesion layer 214 may include titanium nitride or another suitable layer such as titanium, tantalum, tantalum nitride, tungsten, tungsten nitride, molybdenum, combinations of one or more layers, or any other suitable material(s). The deposited conductive layer 426 and barrier and/or adhesion layer 214 may be patterned and etched to form second conductors 202.

In some embodiments, second conductive carbon layer 222 and/or C-based switching material 102 that covers field regions of dielectric 408b (in the embodiment of FIG. 4I-2) also may be patterned and etched with conductive layer 426 and barrier layer 214 (see FIG. 4J-1 and FIG. 4J-2). In at least one embodiment, second conductors 202 are substantially parallel, substantially coplanar conductors that extend in a different direction than first conductors 200.

In other embodiments of the invention, second conductors 202 may be formed using a damascene process in which a dielectric layer is formed, patterned and etched to create openings or voids for conductors 202. The openings or voids may be filled with adhesion layer 214 and conductive layer 426 (and/or a conductive seed, conductive fill and/or barrier layer if needed). Adhesion layer 214 and conductive layer 426 then may be planarized to form a planar surface.

Because of the reduced geometry and location of C-based switching material 102, a large degree of misalignment between C-based switching material 102 and metallization layers 222, 214 and/or 426 may be tolerated during memory cell fabrication.

Following formation of second conductors 202, the resultant structure may be annealed to crystallize the deposited semiconductor material of diodes 104 (and/or to form silicide regions by reaction of silicide-forming metal layer 304 with p+ region 104c). The lattice spacing of titanium silicide and cobalt silicide are close to that of silicon, and it appears that silicide layers may serve as "crystallization templates" or "seeds" for adjacent deposited silicon as the deposited silicon crystallizes (e.g., a silicide layer enhances the crystalline structure of silicon diode 104 during annealing at temperatures of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

Persons of ordinary skill in the art will understand that alternative memory cells in accordance with this invention may be fabricated by other similar techniques.

In some embodiments in accordance with this invention, following formation of C-based switching material 102, an anneal step may be performed prior to depositing additional material. In particular, the anneal may be performed in a vacuum or the presence of one or more forming gases, at a temperature in the range from about 350° C. to about 900° C., for about 30 to about 180 minutes. The anneal preferably is performed in about an 80% ($N_2$):20% ($H_2$) mixture of forming gases, at about 625° C. for about one hour.

Suitable forming gases may include one or more of $N_2$, Ar, and $H_2$, whereas preferred forming gases may include a mixture having above about 75% $N_2$ or Ar and below about 25% $H_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1T to about 760T, whereas preferred pressures may range from about 300T to about 760T.

A queue time of preferably about 2 hours between the anneal and the deposition of additional layers preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

Although not wanting to be bound by any particular theory, it is believed that carbon-based switching material may absorb water from the air over time. Likewise, it is believed that the moisture may increase the likelihood of de-lamination of the carbon-based switching material. In some cases, it also might be acceptable to have a queue time of 2 hours from the time of deposition of carbon-based switching material to deposition of additional layers, skipping the anneal altogether.

Incorporation of such a post-carbon-formation-anneal preferably takes into account other layers of the memory cell, because these other memory cell layers will also be subject to the anneal. For example, the anneal may be omitted or its parameters may be adjusted where the aforementioned preferred anneal parameters would damage the other memory cell layers. The anneal parameters may be adjusted within ranges that result in the removal of moisture without damaging the layers of the annealed memory cell. For instance, the temperature may be adjusted to stay within an overall thermal budget of a memory cell being formed. Likewise, any suitable forming gases, temperatures and/or durations may be used that are appropriate for a particular memory cell. In general, such an anneal may be used with any carbon-based switching material, such as CNT material, graphite, graphene, amorphous carbon, amorphous DLC, silicon carbide, boron carbide and other crystalline forms of carbon.

The foregoing description discloses only exemplary embodiments of the invention. Modifications of the above disclosed apparatus and methods which fall within the scope of the invention will be readily apparent to those of ordinary skill in the art. For instance, other pillar shapes may be used. Any suitable material may be used for conductors 200 and 202 such as copper, aluminum or other conductive layers. Accordingly, although the present invention has been disclosed in connection with exemplary embodiments thereof, it should be understood that other embodiments may fall within the spirit and scope of the invention, as defined by the following claims.

The invention claimed is:

1. A metal-insulator-metal ("MIM") stack comprising:
a dielectric material having an opening;
a first conductive carbon layer within the opening;
a spacer above the first conductive carbon layer and in the opening;
a carbon-based switching material on a sidewall of the spacer; and
a second conductive carbon layer above the carbon-based switching material,
wherein a ratio of a cross sectional area of the opening in the dielectric material to a cross sectional area of the carbon-based switching material on the sidewall of the spacer is at least 5.

2. The MIM stack of claim 1, wherein the carbon-based switching material is in direct contact with the first and second conductive carbon layers.

3. The MIM stack of claim 1, wherein the ratio of the cross sectional area of the opening in the dielectric material to the cross sectional area of the carbon-based switching material on the sidewall of the spacer is at least 15.

4. The MIM stack of claim 1, wherein the carbon-based switching material has a thickness of not more than about 5 nanometers.

5. The MIM stack of claim 1, wherein the carbon-based switching material has a thickness of not more than about 2 nanometers.

6. The MIM stack of claim 1, wherein the carbon-based switching material comprises amorphous carbon.

7. The MIM stack of claim 1, wherein the carbon-based switching material comprises low-hydrogen, silicon-containing carbon having at least about 30 atm % silicon.

8. The MIM stack of claim 1, wherein the carbon-based switching material comprises low-hydrogen, silicon-containing carbon having at least about 40 atm % silicon.

9. The MIM stack of claim 1, wherein the first and second conductive carbon layers comprise carbon layers that include primarily $sp^2$ bonded carbon.

10. The MIM stack of claim 1, wherein the first and second conductive carbon layers have a resistivity of not more than about $100 \times 10^{-3}$ ohm-cm.

11. The MIM stack of claim 1, wherein the first and second conductive carbon layers have a resistivity of not more than about $10 \times 10^{-3}$ ohm-cm.

12. The MIM stack of claim 1, wherein the first and second conductive carbon layers comprise metal carbide layers.

13. A memory cell comprising:
a metal-insulator-metal ("MIM") stack formed above a substrate, the MIM stack having:
a dielectric material having an opening;
a first conductive carbon layer within the opening;
a spacer above the first conductive carbon layer and in the opening;

a carbon-based switching material on a sidewall of the spacer; and a second conductive carbon layer above the carbon-based switching material, wherein a ratio of a cross sectional area of the opening in the dielectric material to a cross sectional area of the carbon-based switching material on the sidewall of the spacer is at least 5; and a steering element coupled to the MIM stack.

14. The memory cell of claim 13, wherein the carbon-based switching material is in direct contact with the first and second conductive carbon layers.

15. The memory cell of claim 13, wherein the ratio of the cross sectional area of the opening in the dielectric material to the cross sectional area of the carbon-based switching material on the sidewall of the spacer is at least 15.

16. The memory cell of claim 13, wherein the carbon-based switching material has a thickness of not more than about 5 nanometers.

17. The memory cell of claim 13, wherein the carbon-based switching material has a thickness of not more than about 2 nanometers.

18. The memory cell of claim 13, wherein the steering element comprises a polycrystalline or Schottky diode.

* * * * *